US012616076B2

(12) United States Patent
Fukuda

(10) Patent No.: US 12,616,076 B2
(45) Date of Patent: Apr. 28, 2026

(54) SEMICONDUCTOR DEVICE

(71) Applicant: FUJI ELECTRIC CO., LTD.,
Kawasaki (JP)

(72) Inventor: Taisuke Fukuda, Matsumoto-city (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 406 days.

(21) Appl. No.: 18/473,462

(22) Filed: Sep. 25, 2023

(65) Prior Publication Data

US 2024/0170454 A1 May 23, 2024

(30) Foreign Application Priority Data

Nov. 17, 2022 (JP) ................................. 2022-184185

(51) Int. Cl.
H01L 23/495 (2006.01)
H01L 23/00 (2006.01)
H01L 25/07 (2006.01)
(52) U.S. Cl.
CPC .. H01L 23/49575 (2013.01); H01L 23/49562
(2013.01); H01L 23/49586 (2013.01); H01L
24/40 (2013.01); H01L 25/072 (2013.01);
*H01L 2224/37011* (2013.01); *H01L 2224/4005*
(2013.01); *H01L 2224/40111* (2013.01); *H01L*
*2224/40137* (2013.01); *H01L 2224/4103*
(2013.01); *H01L 2224/41105* (2013.01); *H01L*
*2224/41174* (2013.01)

(58) Field of Classification Search
CPC ......... H01L 23/49562; H01L 23/49575; H01L
2224/37011; H01L 2224/41105; H01L
2224/41175; H01L 2224/40111
See application file for complete search history.

(56) References Cited

U.S. PATENT DOCUMENTS

| | | | |
|---|---|---|---|
| 11,328,985 B2 | 5/2022 | Hayashiguchi et al. | |
| 11,664,298 B2 | 5/2023 | Hayashiguchi et al. | |
| 2003/0168252 A1* | 9/2003 | Schmid ................... | H01L 24/80 257/691 |
| 2016/0148859 A1* | 5/2016 | Muto ...................... | H01L 24/33 257/676 |
| 2016/0293563 A1* | 10/2016 | Fujino ..................... | H01L 24/72 |
| 2019/0057921 A1* | 2/2019 | Ooshima ............. | H01L 21/4803 |
| 2021/0066256 A1* | 3/2021 | Im ......................... | H01L 21/565 |
| 2021/0098347 A1 | 4/2021 | Hayashiguchi et al. | |

(Continued)

FOREIGN PATENT DOCUMENTS

| | | |
|---|---|---|
| JP | 2006-086438 A | 3/2006 |
| JP | 2013-051295 A | 3/2013 |

(Continued)

*Primary Examiner* — Yu Chen

(57) ABSTRACT

A semiconductor device includes: a first semiconductor chip
and a second semiconductor chip each including a first main
electrode on a bottom surface side and a second main
electrode on a top surface side; a conductive member
provided to electrically connect the first main electrode of
the first semiconductor chip to the second main electrode of
the second semiconductor chip; a first external terminal
electrically connected to the second main electrode of the
first semiconductor chip and partly opposed to the conduc-
tive member, and a resin member provided to be at least
partly arranged between the conductive member and the first
external terminal.

15 Claims, 18 Drawing Sheets

(56) References Cited

U.S. PATENT DOCUMENTS

| | | | |
|---|---|---|---|
| 2021/0308791 A1 | 10/2021 | Fuji | |
| 2021/0313256 A1* | 10/2021 | McPherson | H01L 23/49531 |
| 2022/0238475 A1 | 7/2022 | Stoek et al. | |
| 2022/0246507 A1 | 8/2022 | Hayashiguchi et al. | |
| 2022/0254696 A1 | 8/2022 | Kessler et al. | |
| 2023/0326907 A1* | 10/2023 | Gong | H01L 24/48 |
| | | | 257/48 |
| 2023/0352376 A1* | 11/2023 | Kanda | H01L 23/49551 |

FOREIGN PATENT DOCUMENTS

| | | | |
|---|---|---|---|
| JP | 2021-009973 A | 1/2021 | |
| WO | 2019/239771 A1 | 12/2019 | |
| WO | 2020/045263 A1 | 3/2020 | |

* cited by examiner

F I G. 2
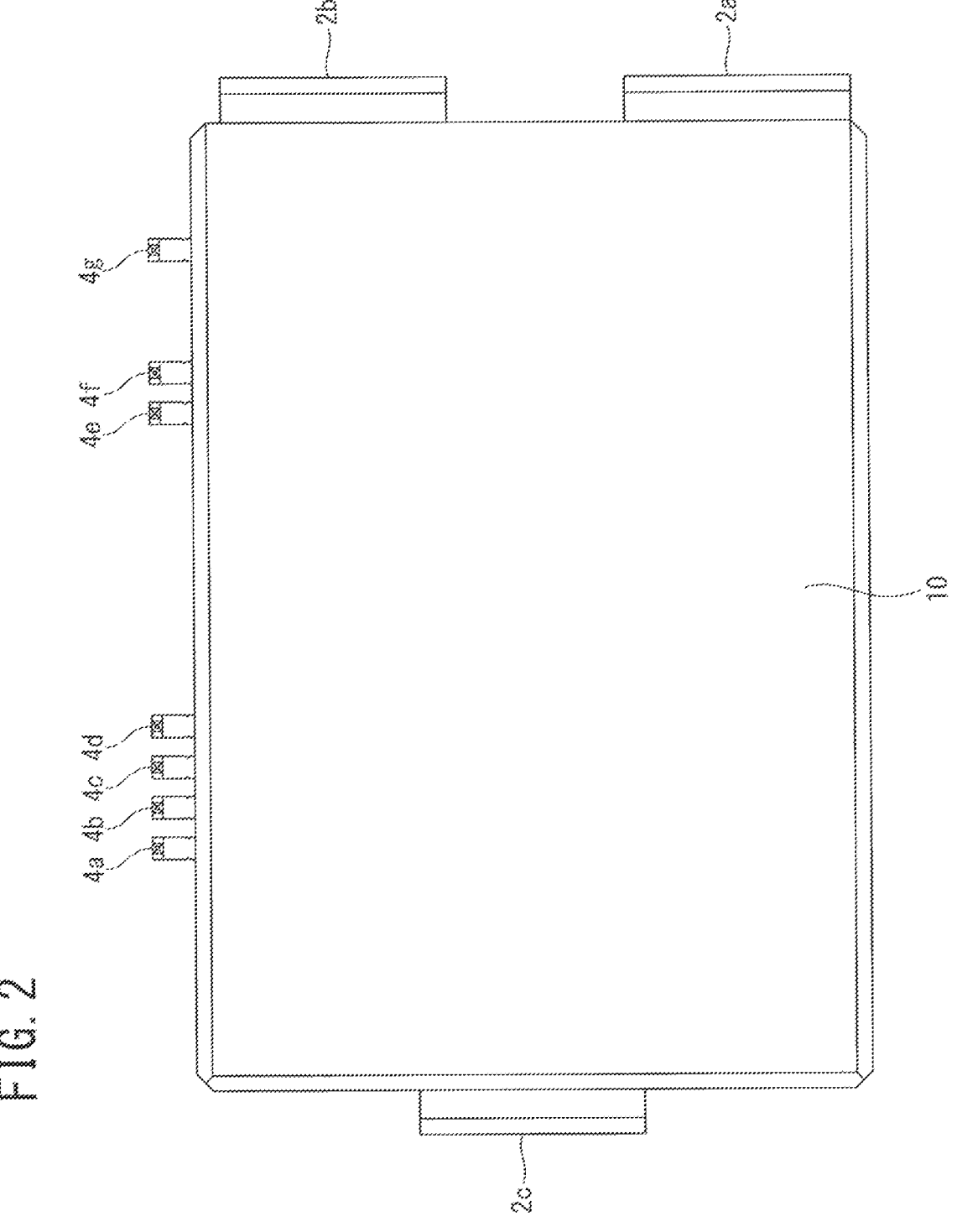

SEMICONDUCTOR DEVICE

CROSS-REFERENCE TO RELATED APPLICATION

This application claims benefit of priority under 35 USC 119 based on Japanese Patent Application No. 2022-184185 filed on Nov. 17, 2022, the entire contents of which are incorporated by reference herein.

BACKGROUND OF THE INVENTION

1. Field of the Invention

The present invention relates to a semiconductor device (a power semiconductor module) equipped with power semiconductor elements.

2. Description of the Related Art

JP 2006-86438 A discloses a semiconductor module having a busbar structure for connecting a plurality of switching elements to a power supply, in which positive/negative-electrode power-supply connection terminals of the respective switching elements are integrally formed to be housed in a resin case and are arranged to have opposed regions in which the respective main surfaces of the connection terminals are at least partly opposed substantially parallel to each other, and an insulating member is arranged between the respective opposed regions by insert molding so as not lead the resin to be in contact with the insulating member.

JP 2021-9973 A discloses a lead frame having an irregular bar-like shape including a thick part and a thin part, in which the thick part has a first protrusion part on which a semiconductor element is mounted and a second protrusion part having a smaller thickness than the first protrusion part, the first protrusion part and the second protrusion part are alternately aligned in the longitudinal direction of the thick part, and the top surface and the side surfaces of the thin part, the side surfaces of the first protrusion part, and the top surface and the side surfaces of the second protrusion part are roughened.

JP 2013-51295 A discloses a semiconductor device including a clip provided with penetration holes or a comb-like part so as to increase the surface area to avoid an increase in resistance of the clip caused by the influence of the skin effect, the clip being further provided with an opening on the side surface so as to avoid a cause of bubbles or voids due to an inclusion of air in the penetration holes or sealing resin provided at the lower part of the clip to improve the reliability of quality of products.

US 2022/0254696 A1 discloses a package and a manufacturing method, the package including a carrier, at least one component mounted on the carrier, and a clip arranged above the carrier and having a through hole, wherein at least part of at least one of the at least one component and/or at least part of an electrically conductive connection element electrically connecting the at least one component is at least partially positioned inside the through hole.

US 2022/0238475 A1 discloses a semiconductor device including a semiconductor die attached to a substrate, and a metal clip attached to a side of the semiconductor die facing away from the substrate by a soldered joint, wherein the metal clip has a plurality of slots dimensioned so as to take up at least 10% of a solder paste reflowed to form the soldered joint.

WO 2019/239771 A1 discloses a semiconductor module including a semiconductor device and a bus bar, in which the semiconductor device includes an insulating substrate having a main surface and a back surface that face opposite to each other in a thickness direction, a conductive member arranged on the main surface, a plurality of switching elements electrically connected to the conductive member, a first input terminal having a first terminal portion and electrically connected to the conductive member, and a second input terminal having a second terminal portion overlapping with the first terminal portion as viewed in the thickness direction, the second input terminal being spaced apart from the first input terminal and the conductive member in the thickness direction and electrically connected to the plurality of switching elements, and in which the bus bar includes a first supply terminal and a second supply terminal spaced apart from the first supply terminal in the thickness direction, the second supply terminal at least partially overlapping with the first supply terminal as viewed in the thickness direction, the first supply terminal being electrically connected to the first terminal portion, the second supply terminal being electrically connected to the second terminal portion.

WO 2020/045263 A1 discloses a joint structure including a first metal member and a second metal member that overlap with each other as viewed in a first direction and that are joined to each other, the joint structure further including a welded portion in which a part of the first metal member and a part of the second metal member are fused to each other in an area where the first metal member and the second metal member overlap with each other, in which the welded portion includes an outer circumferential edge that is annular as viewed in the first direction, and a plurality of linear marks each extending from an inside of the welded portion toward the outer circumferential edge as viewed in the first direction, and each of the plurality of linear marks is curved to bulge to one side in an annular direction along the outer circumferential edge.

The conventional power semiconductor modules as described above have a problem of an increase in the wiring area if a plurality of (a large number of) semiconductor chips are mounted on the circuit pattern of the insulated circuit substrate so as to be electrically connected to each other via lead frames or bonding wires.

SUMMARY OF THE INVENTION

In view of the foregoing problems, the present invention provides a semiconductor device having a configuration capable of avoiding an increase in wiring area so as to avoid an increase in chip size and cost.

An aspect of the present invention inheres in a semiconductor device including: a first semiconductor chip and a second semiconductor chip each including a first main electrode on a bottom surface side and a second main electrode on a top surface side; a conductive member provided to electrically connect the first main electrode of the first semiconductor chip to the second main electrode of the second semiconductor chip; a first external terminal electrically connected to the second main electrode of the first semiconductor chip and partly opposed to the conductive member; and a resin member provided to be at least partly arranged between the conductive member and the first external terminal.

The semiconductor device may include a half bridge circuit including a lower arm implemented by the first semiconductor chip and an upper arm implemented by the second semiconductor chip.

In the semiconductor device, the resin member may be formed integrally with the conductive member and the first external terminal.

In the semiconductor device, the resin member may be fixed to either the conductive member or the first external terminal.

In the semiconductor device, the resin member may be provided with a support part on a bottom surface side.

In the semiconductor device, the conductive member and the resin member may be provided with engagement parts engaged with each other.

In the semiconductor device, the resin member may be provided with an opening at a position overlapping with a control wiring region of the second semiconductor chip.

In the semiconductor device, a surface of the resin member may be subjected to roughening treatment.

The semiconductor device may further include: a first conductive substrate to which the bottom surface side of the first semiconductor chip is bonded; and a second conductive substrate to which the bottom surface side of the second semiconductor chip is bonded.

The semiconductor device may further include: a second external terminal bonded to the first conductive substrate; and a third external terminal bonded to the second conductive substrate.

The semiconductor device may further include: a first printed board arranged on a top surface of the first conductive substrate and electrically connected to a control electrode on the top surface side of the first semiconductor chip; and a second printed board arranged on a top surface of the second conductive substrate and electrically connected to a control electrode on the top surface side of the second semiconductor chip.

The semiconductor device may further include: a resin sheet arranged on a bottom surface side of the first conductive substrate and the second conductive substrate; and a cooling device arranged on a bottom surface side of the resin sheet.

The semiconductor device may further include a sealing member provided to seal the first semiconductor chip and the second semiconductor chip.

In the semiconductor device, the conductive member may include: a chip bonding part bonded to the second main electrode of the second semiconductor chip; and a pad bonding part bonded to a pad on a top surface side of the first conductive substrate.

In the semiconductor device, the first external terminal may include a chip bonding part bonded to the second main electrode of the first semiconductor chip; and a connection part opposed to the conductive member.

It should be noted that the above summary of the invention does not list all the necessary features of the invention. Subcombinations of these feature groups can also be inventions.

BRIEF DESCRIPTION OF THE DRAWINGS

FIG. 2 is a plan view corresponding to FIG. 1;

4

Figure 3:
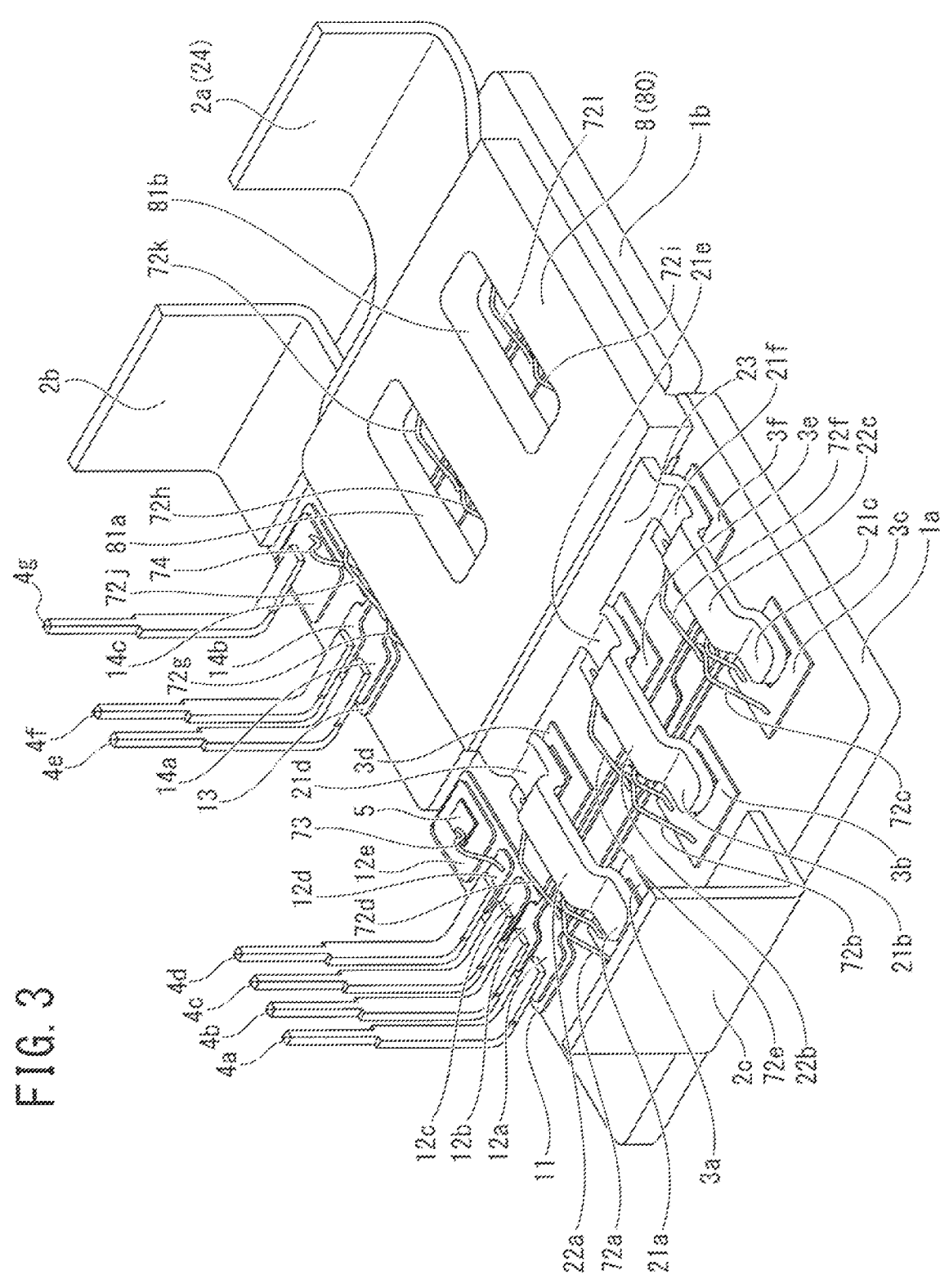
FIG. 3 is a perspective view omitting the illustration of a part of the semiconductor device according to the first embodiment.
Figure 4:
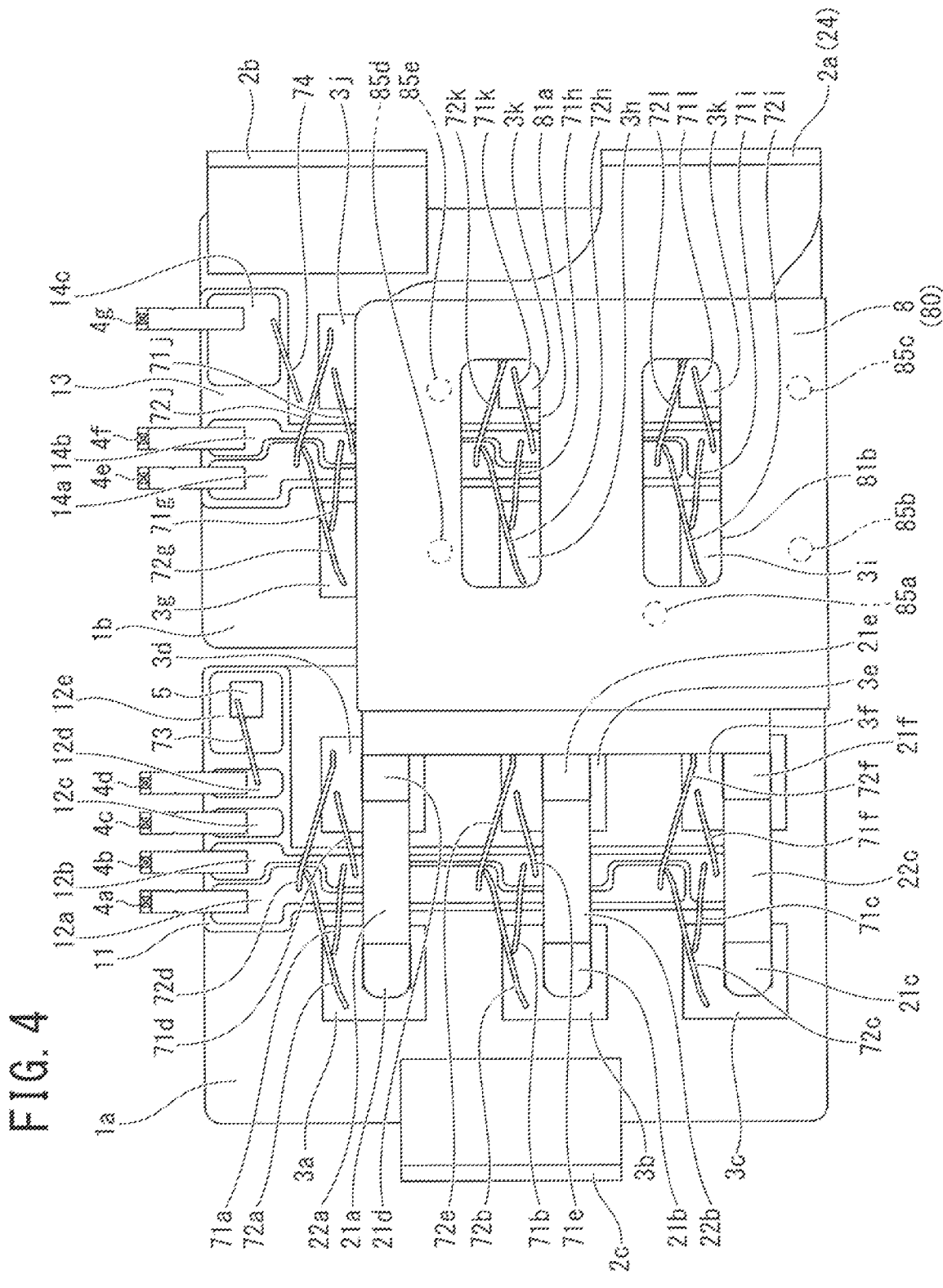
Figure 6:
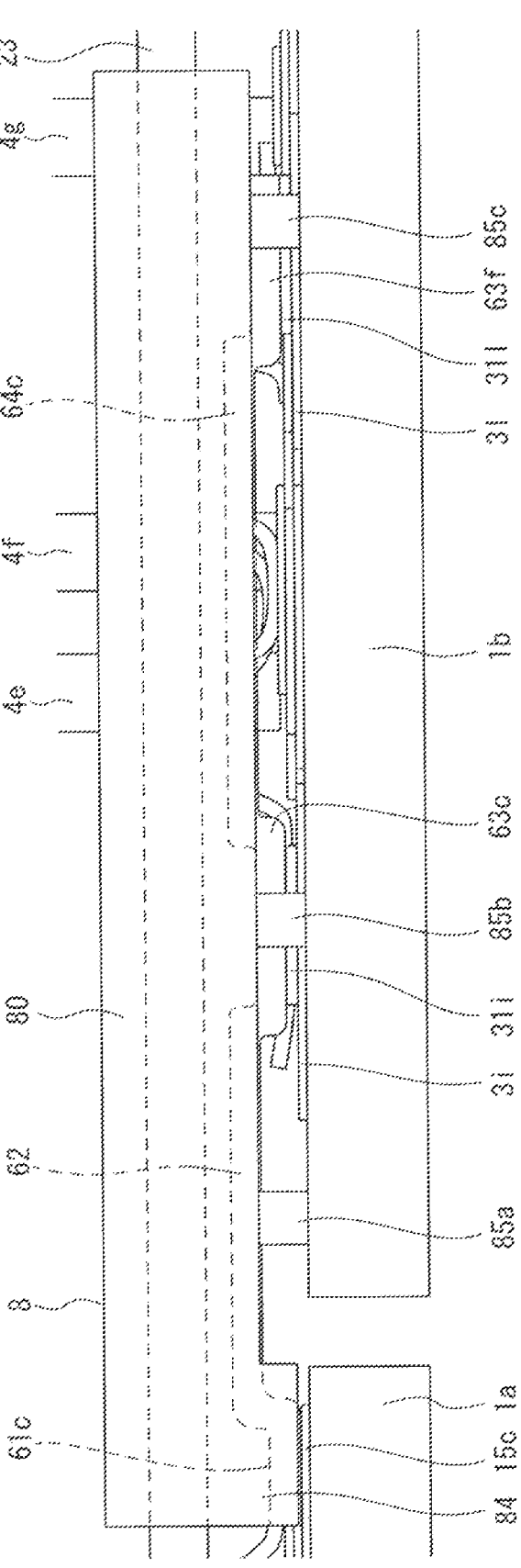
Figure 7:
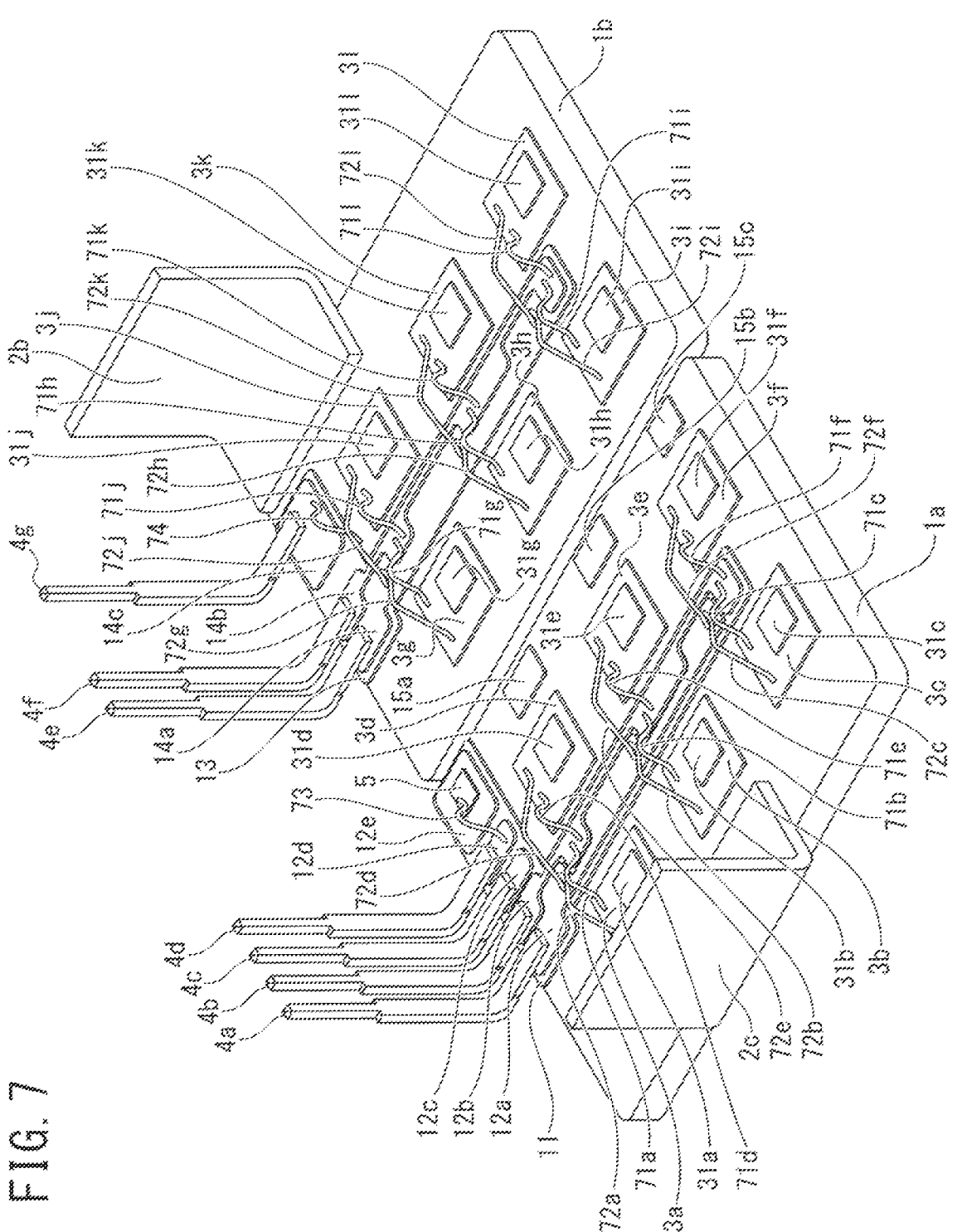
Figure 8:
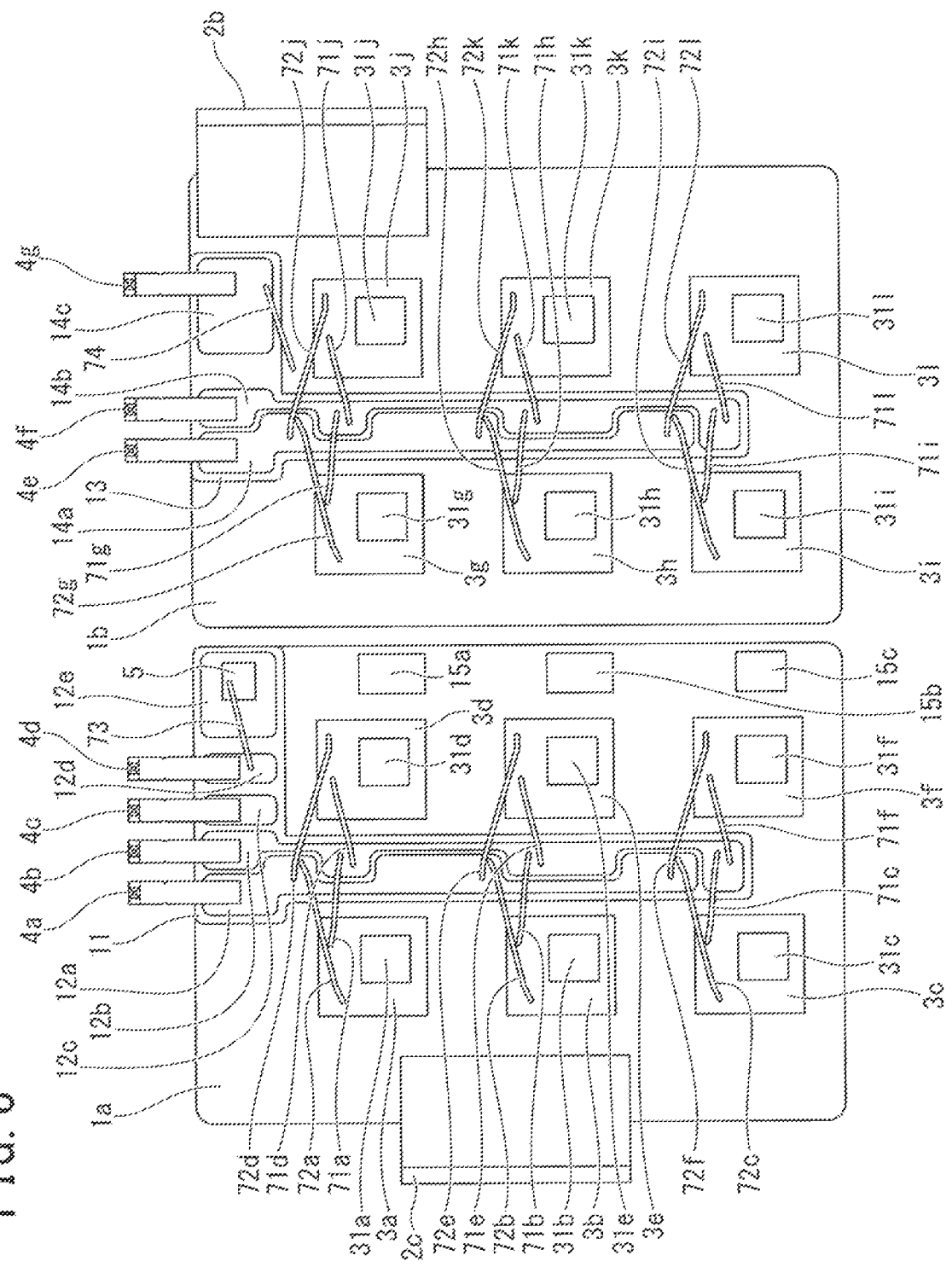
Figure 9:
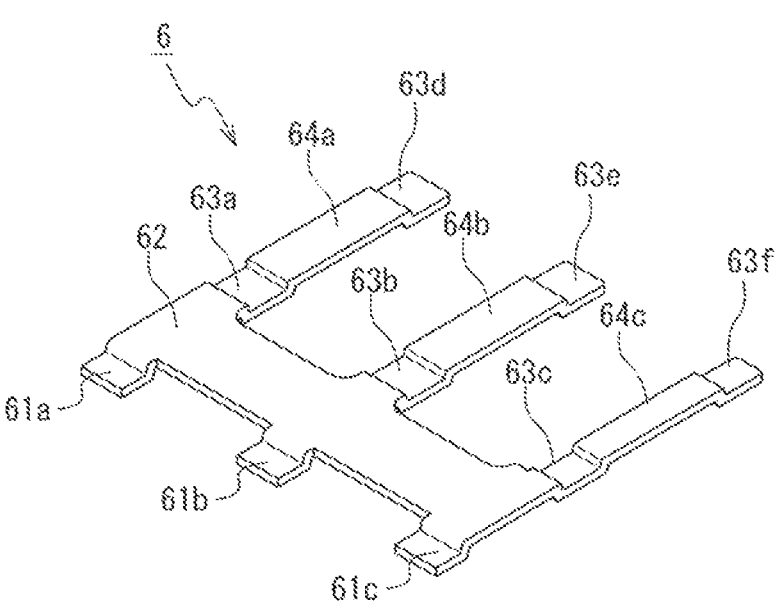
Figure 10:
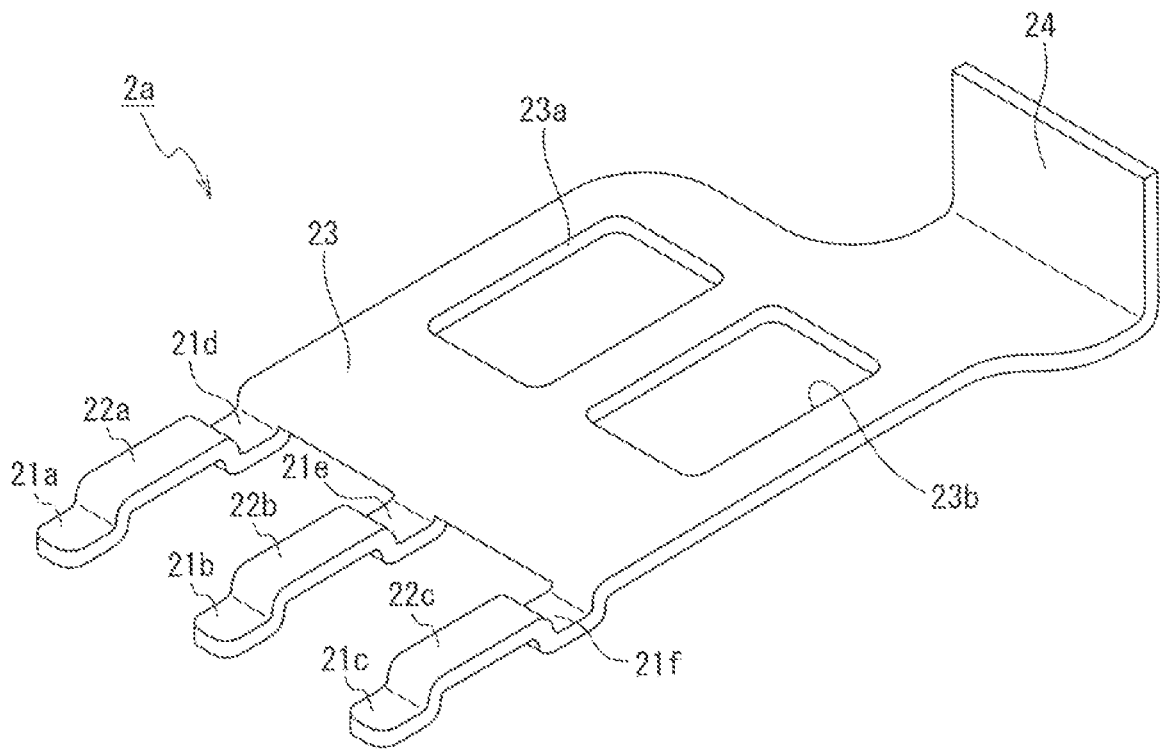
Figure 11:
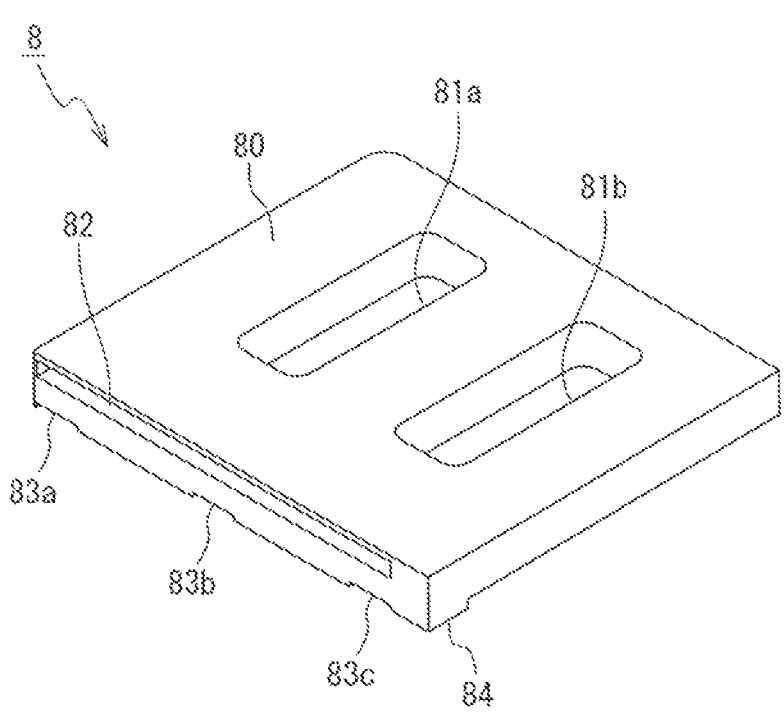
Figure 12:
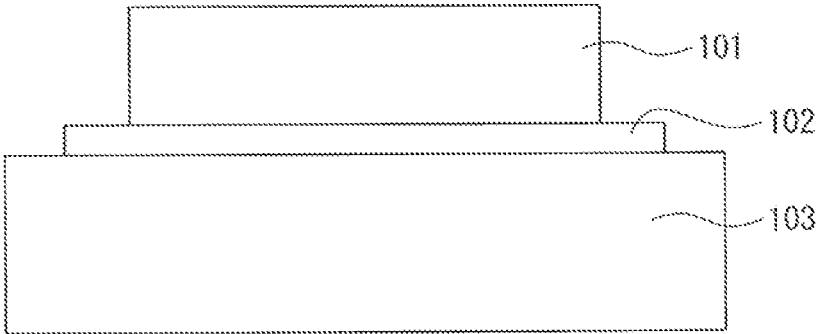
Figure 13:
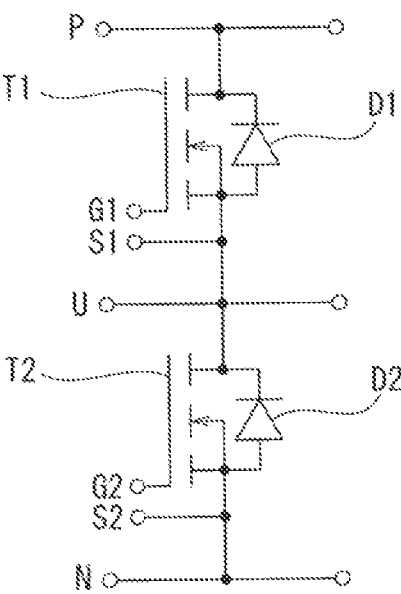
Figure 14:
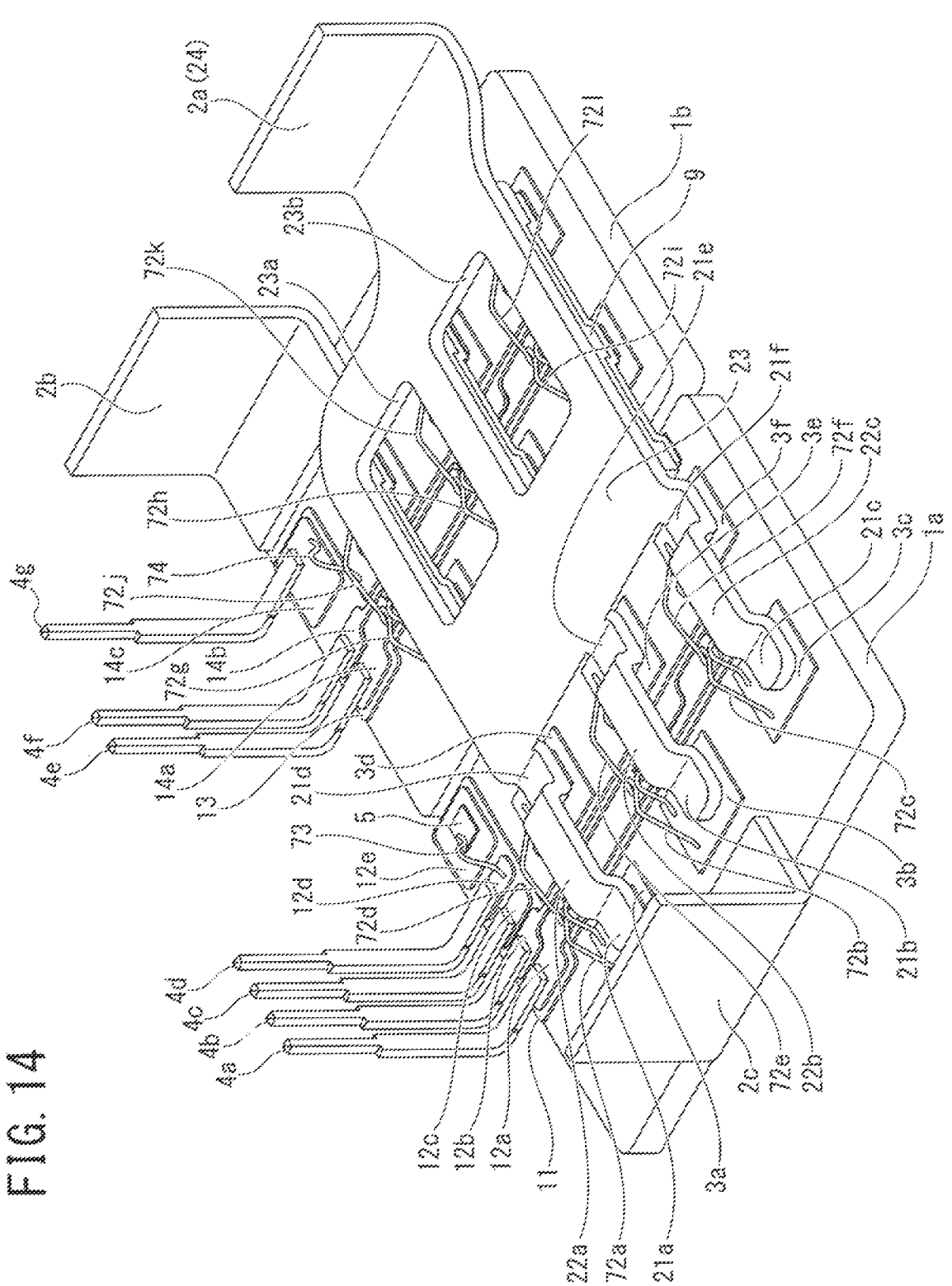
Figure 15:
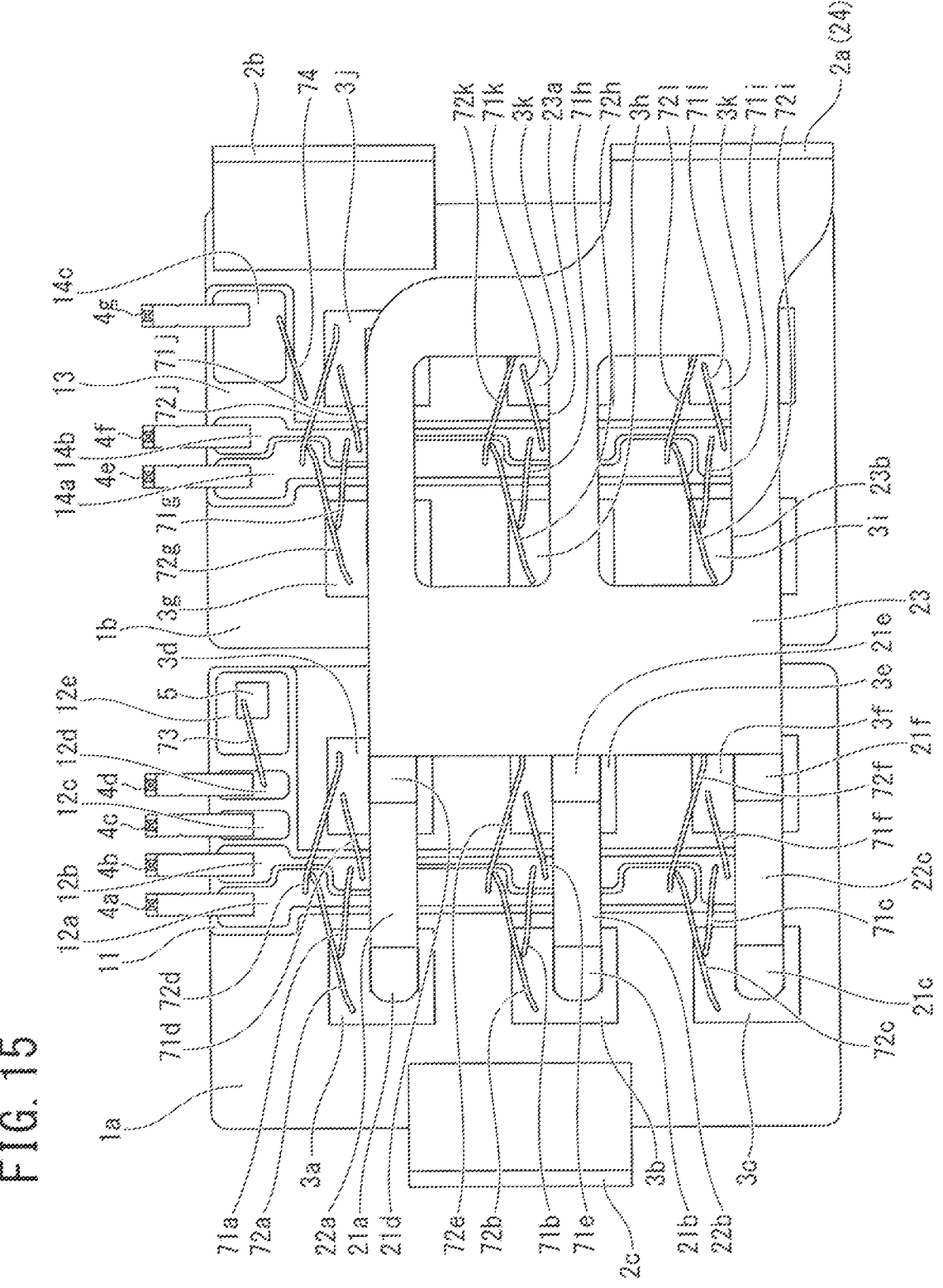
Figure 16:
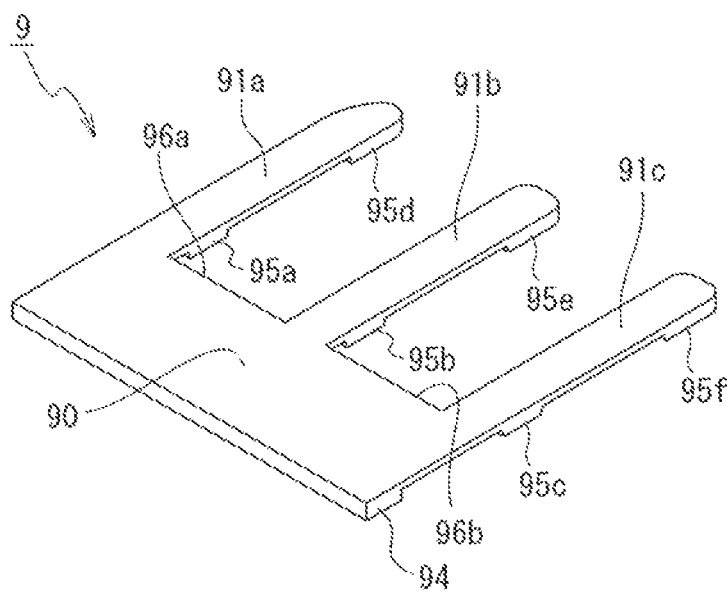
Figure 18:
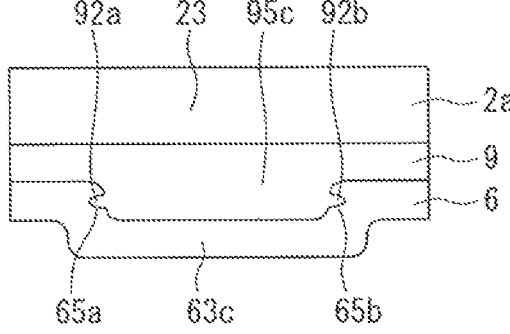
Figure 20:
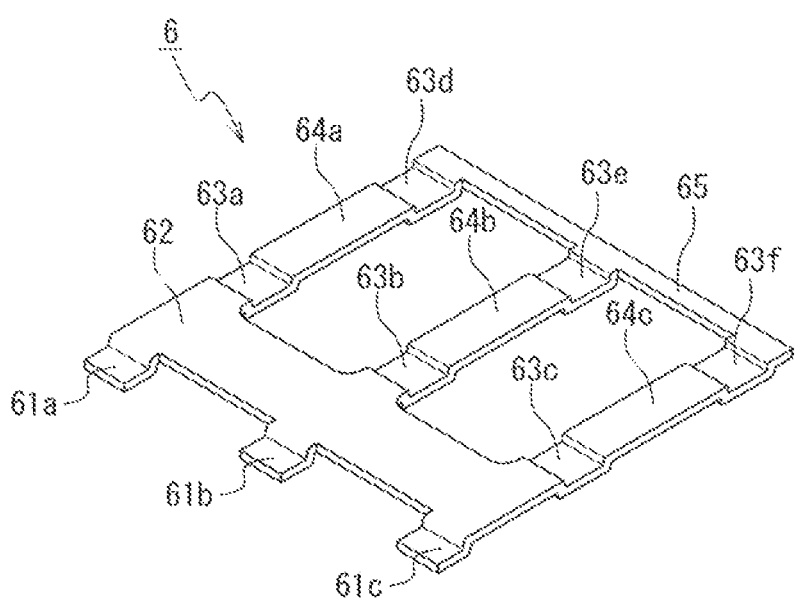
Figure 21:
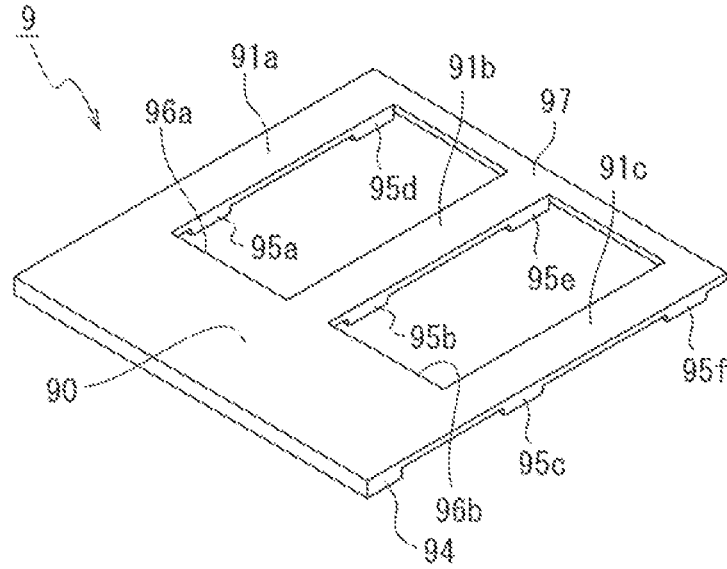

FIG. 4 is a plan view corresponding to FIG. 3;

Figure 5:
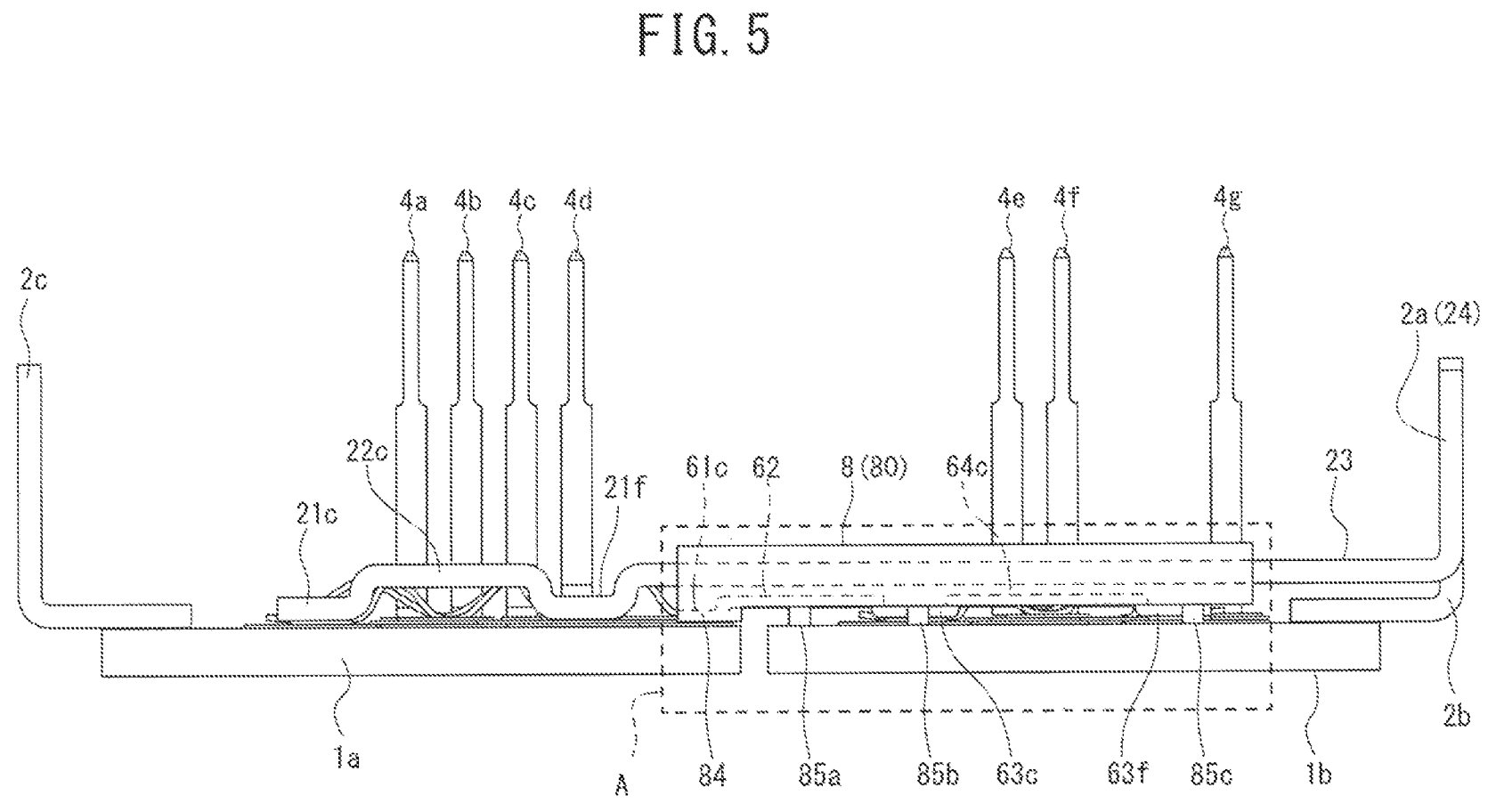

FIG. 5 is a side view corresponding to FIG. 3 and FIG. 4;

FIG. 6 is an enlarged side view illustrating region A in FIG. 5;

FIG. 7 is a perspective view omitting the illustration of a part of the semiconductor device according to the first embodiment;

FIG. 8 is a plan view corresponding to FIG. 7;

FIG. 9 is a perspective view illustrating a conductive member of the semiconductor device according to the first embodiment;

FIG. 10 is a perspective view illustrating a negative electrode terminal of the semiconductor device according to the first embodiment;

FIG. 11 is a perspective view illustrating a resin member of the semiconductor device according to the first embodiment;

FIG. 12 is a side view illustrating a packaged structure of the semiconductor device according to the first embodiment;

FIG. 13 is an equivalent circuit diagram of the semiconductor device according to the first embodiment;

FIG. 14 is a perspective view omitting the illustration of a part of a semiconductor device according to a second embodiment;

FIG. 15 is a plan view corresponding to FIG. 14;

FIG. 16 is a perspective view illustrating a resin member of the semiconductor device according to the second embodiment;

Figure 17:
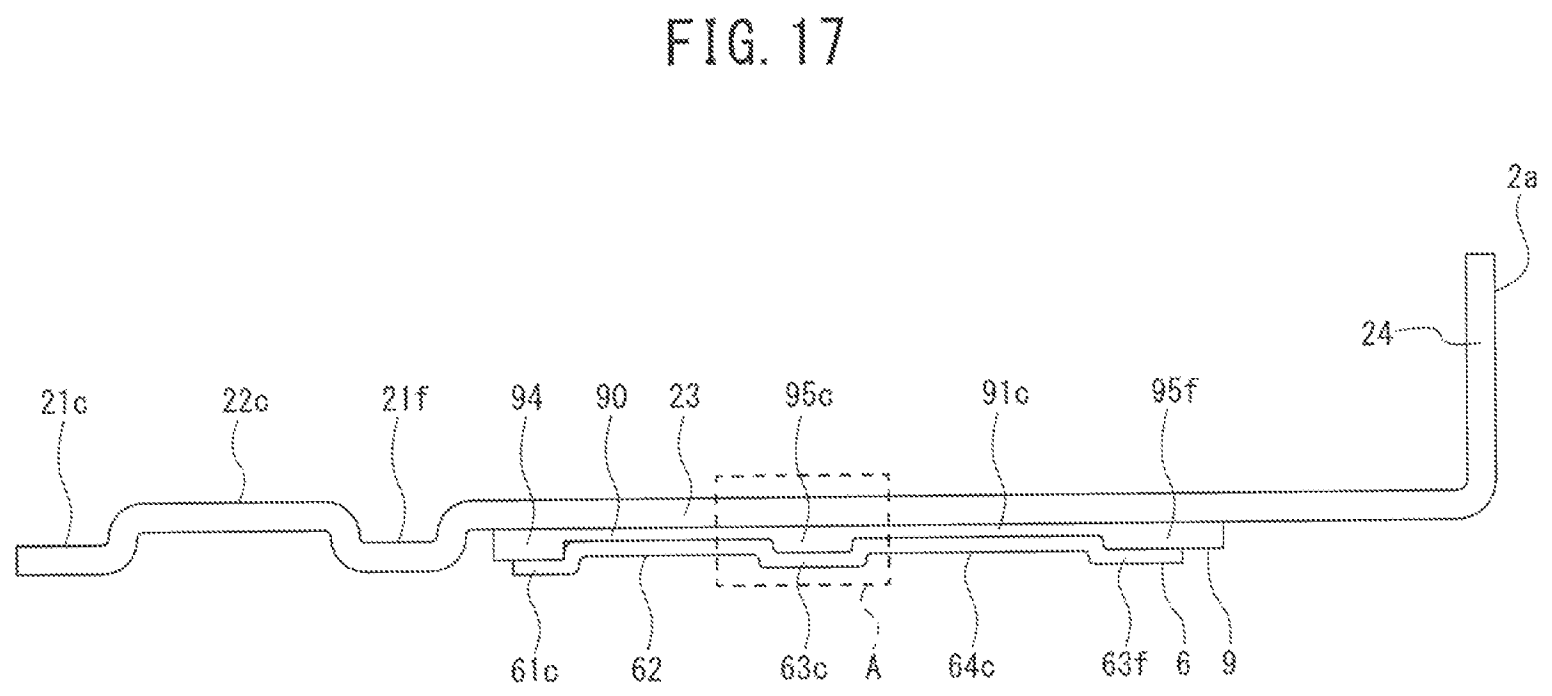

FIG. 17 is a side view illustrating a laminated structure body of the semiconductor device according to the second embodiment;

FIG. 18 is an enlarged side view illustrating region A in FIG. 17;

Figure 19:
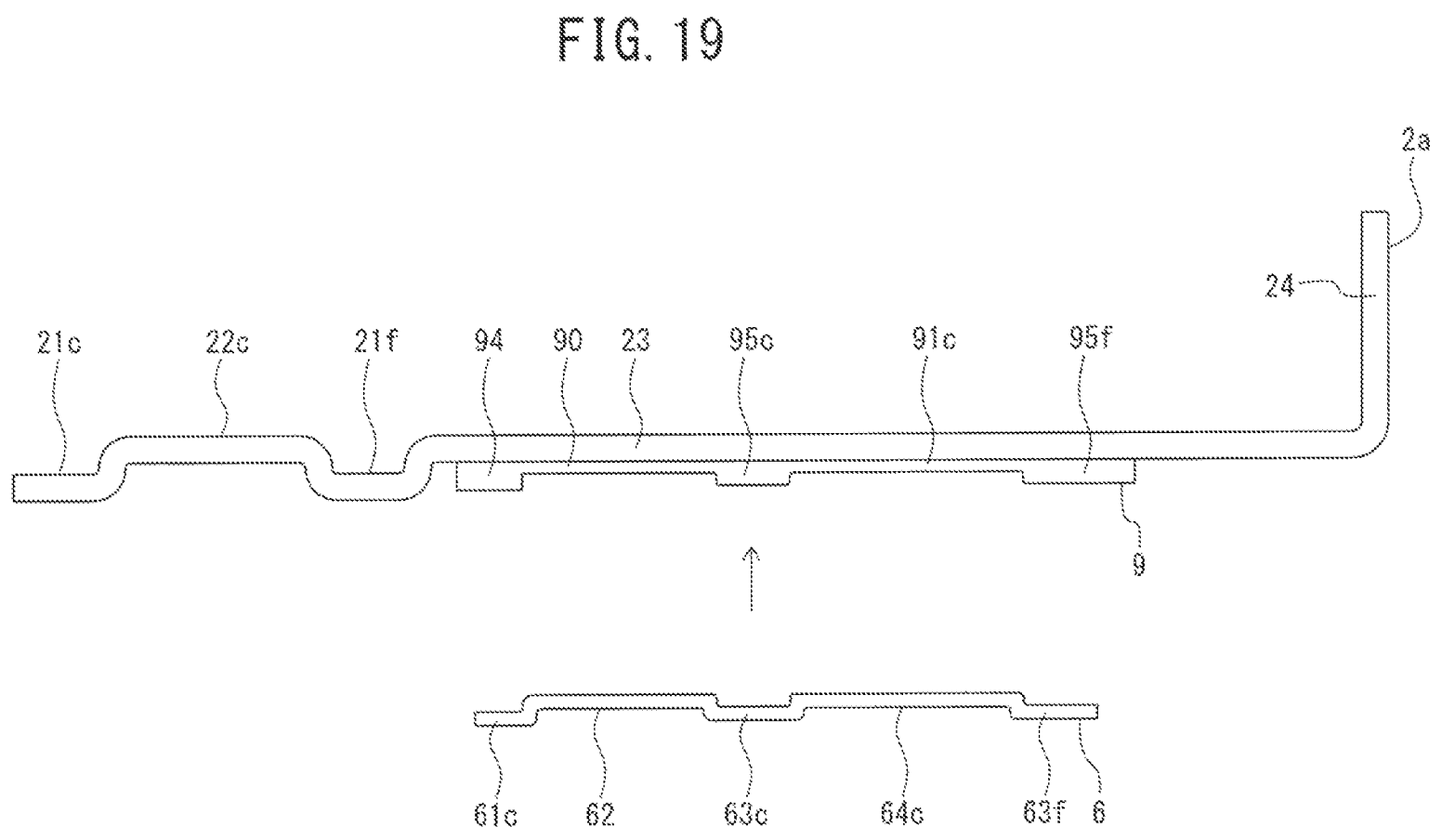

FIG. 19 is a side view for explaining a method of assembling a laminated structure illustrated in FIG. 17;

FIG. 20 is a perspective view illustrating a conductive member of a semiconductor device according to a modified example of the second embodiment; and FIG. 21 is a perspective view illustrating a resin member of the semiconductor device according to the modified example of the second embodiment.

With reference to the drawings, first and second embodiments of the present invention will be described below.

In the drawings, the same or similar elements are indicated by the same or similar reference numerals.

The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

Additionally, definitions of directions such as "upper". "lower", "upper and lower", "left", "right", and "left and right" in the following description are simply definitions for convenience of description, and do not limit the technological concept of the present invention. For example, when observing an object rotated by 90°, the "upper and lower" are converted to "left and right" to be read, and when observing an object rotated by 180°, the "upper and lower" are read reversed, which should go without saying. In addition, an "upper surface" and a "lower surface", respectively, may be read as "front surface" and "back surface". In addition, the "first main surface" and the "second main surface" of each member are main surfaces facing each other. For example, if the "first main surface" is the upper surface, the "second main surface" is the lower surface.

FIRST EMBODIMENT

<Structure of Semiconductor Device>

Figure 1:
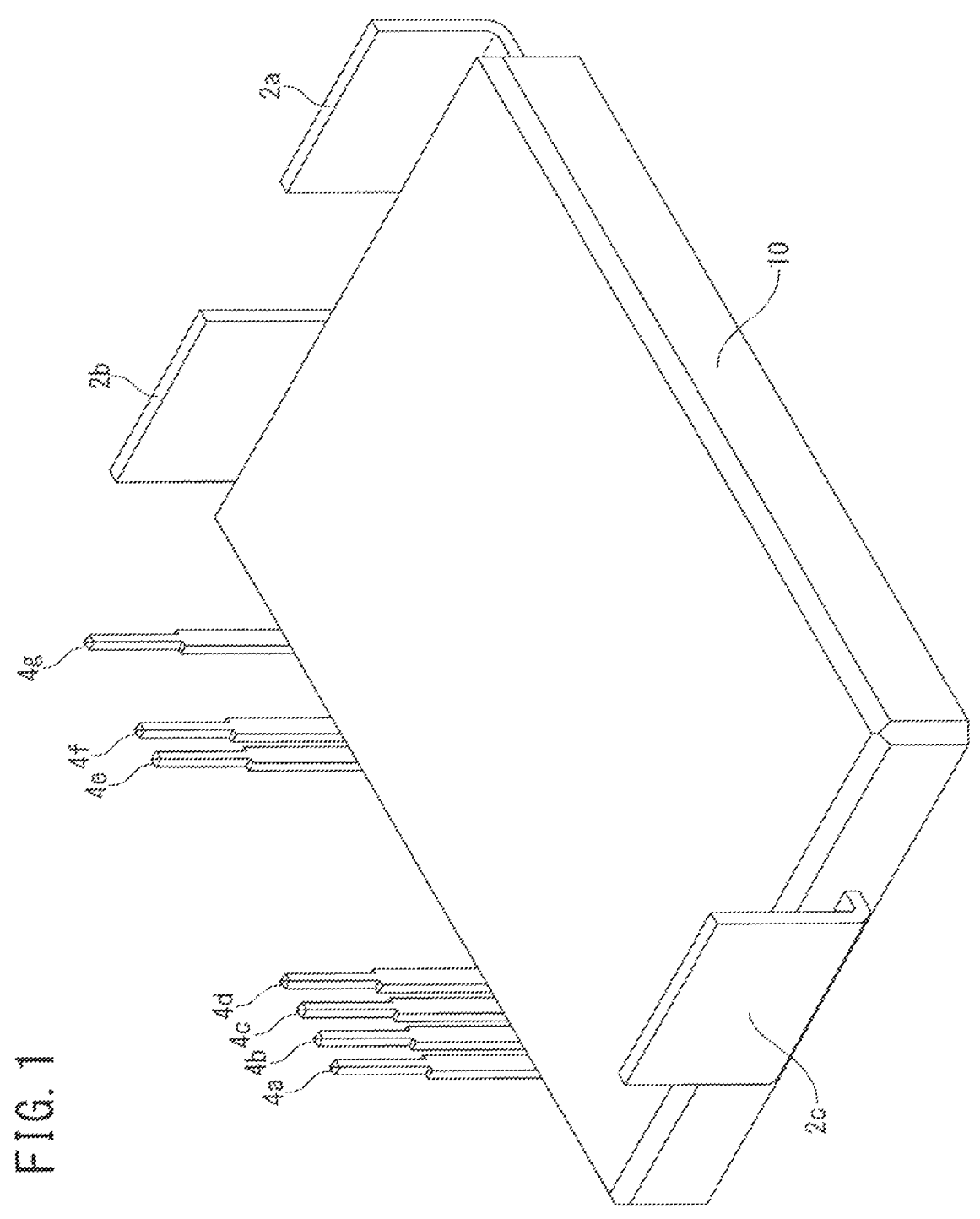
FIG. 1 is a perspective view illustrating a semiconductor device according to a first embodiment.

FIG. 1 is a perspective view illustrating a semiconductor device (a power semiconductor module) according to a first embodiment, and FIG. 2 is a plan view illustrating the semiconductor device according to the first embodiment. As illustrated in FIG. 1 and FIG. 2, the semiconductor device according to the first embodiment includes a sealing resin 10 that seals power semiconductor elements (semiconductor chips), an external terminal (a negative electrode terminal) 2a, an external terminal (a positive electrode terminal) 2b, an external terminal (an output terminal) 2c, and control terminals 4a to 4g each projecting from the sealing resin 10.

The sealing resin 10 has a substantially rectangular parallelepiped. The negative electrode terminal 2a and the positive electrode terminal 2b project from the common one surface of the substantially rectangular parallelepiped of the sealing resin 10. The output terminal 2c projects from another one surface of the substantially rectangular parallelepiped of the sealing resin 10 opposed to the surface from which the negative electrode terminal 2a and the positive electrode terminal 2b project. The control terminals 4a to 4g project from still another one surface of the substantially rectangular parallelepiped of the sealing resin 10 located between the surface from which the negative electrode terminal 2a and the positive electrode terminal 2b project and the surface from which the output terminal 2c projects.

The sealing resin 10 is made of resin having the insulating properties such as epoxy resin. The output terminal 2c, the positive electrode terminal 2b, the negative electrode terminal 2a, and the control terminals 4a to 4g are each made from conductive material such as copper (Cu), a Cu alloy, aluminum (Al), or an Al alloy, for example.

FIG. 3 is a perspective view illustrating the semiconductor device according to the first embodiment while omitting the sealing resin 10 illustrated in FIG. 1 and FIG. 2. FIG. 4 is a plan view corresponding to FIG. 3, FIG. 5 is a side view corresponding to FIG. 3, and FIG. 6 is an enlarged side view of region A in FIG. 5.

As illustrated in FIG. 3 to FIG. 6, the semiconductor device according to the first embodiment includes a conductive substrate 1a and a conductive substrate 1b arranged separately from each other. The conductive substrate 1a and the conductive substrate 1b each have a substantially rectangular planar pattern. The conductive substrate 1a and the conductive substrate 1b are each made from conductive material such as copper (Cu) and aluminum (Al), for example. The respective bottom surfaces of the conductive substrate 1a and the conductive substrate 1b are exposed on the sealing resin 10 illustrated in FIG. 1 and FIG. 2.

The output terminal 2c is a flat plate bent into an L-shape, and is bonded to the conductive substrate 1a by use of bonding material such as solder or sintered material or by direct bonding. The positive electrode terminal 2b is a flat plate bent into an L-shape, and is bonded to the conductive substrate 1b by use of bonding material such as solder or sintered material or by direct bonding. The negative electrode terminal 2a is arranged next to the positive electrode terminal 2b, and includes an external connection part 24 that is a flat plate bent into an L-shape. The negative electrode terminal 2a extends toward the output terminal 2c so as to be elongated across the conductive substrate 1a and the conductive substrate 1b.

Although not illustrated in FIG. 3 or FIG. 4, a conductive member (also referred to as an "intermediate clip" or a "lead frame") 6 illustrated in FIG. 9 is interposed between the negative electrode terminal 2a and the respective conductive substrates 1a and 1b. The conductive member 6 is arranged to be separately opposed to a part of the negative electrode terminal 2a. A part of the negative electrode terminal 2a and a part of the conductive member 6 are covered with a resin member 8.

The negative electrode terminal 2a, the conductive member 6, and the resin member 8 are integrated together by integral molding so as to implement an integrated structure body (2a, 6, 8). The resin member 8 is partly interposed between the negative electrode terminal 2a and the conductive member 6. The integration molding of the negative electrode terminal 2a, the conductive member 6, and the resin member 8 while keeping a gap between the negative electrode terminal 2a and the conductive member 6 with the resin member 8 interposed can ensure low inductance and insulation properties, and enables a void management (evaluation). Further, integrating the negative electrode terminal 2a, the conductive member 6, and the resin member 8 together as a single component can avoid an increase in cost derived from a complication of jigs or lead frames, and can lead to a decrease in the manufacturing steps. The respective structures of the negative electrode terminal 2a, the conductive member 6, and the resin member 8 are described below.

FIG. 7 is a perspective view illustrating the semiconductor device according to the first embodiment while omitting the illustration of the sealing resin 10 illustrated in FIG. 1 and FIG. 2 and further omitting the illustration of the integrated structure body (2a, 6, 8) implemented by the negative electrode terminal 2a, the conductive member 6, and the resin member 8. FIG. 8 is a plan view corresponding to FIG. 7.

As illustrated in FIG. 7 and FIG. 8, the semiconductor device according to the first embodiment includes a plurality of (six) power semiconductor elements (semiconductor chips) 3a to 3f arranged on the top surface side of the conductive substrate 1a, and a plurality of (six) power semiconductor elements (semiconductor chips) 3g to 3l arranged on the top surface side of the conductive substrate 1b. The semiconductor chips 3a to 3f are bonded onto the conductive substrate 1a by use of bonding material such as solder or sintered material. The semiconductor chips 3g to 3l are bonded onto the conductive substrate 1b by use of bonding material such as solder or sintered material.

The semiconductor device according to the first embodiment is illustrated with a case in which the semiconductor chips 3a to 3l are each a MOSFET, and is illustrated with a "2-in-1" power semiconductor module including two sets of the six MOSFETs arranged in parallel, the two sets being arranged in series. The set of the semiconductor chips 3a to 3f serves as a lower arm of a half bridge circuit for one phase in a three-phase inverter circuit, and the other set of the semiconductor chips 3g to 3l serves as an upper arm. The semiconductor device according to the first embodiment is not limited to the 2-in-1 semiconductor module, and may be a 6-in-1 semiconductor module instead.

The semiconductor chips 3a to 3l include semiconductor substrates, first main electrodes (drain electrodes) provided on the bottom surface side of the semiconductor substrate, and second main electrodes (source electrodes) 31a to 31l and control electrodes (gate electrodes) provided on the top surface side of the semiconductor substrate. The respective drain electrodes of the semiconductor chips 3a to 3f are electrically connected to the conductive substrate 1*a*. The respective drain electrodes of the semiconductor chips 3*g* to 3*l* are electrically connected to the conductive substrate 1*b*.

The respective semiconductor substrates of the semiconductor chips 3*a* to 3*l* include silicon (Si), silicon carbide (SIC), gallium nitride (GaN), or gallium oxide (Ga$_2$O$_3$), for example. The arranged positions and the number of the semiconductor chips 3*a* to 3*l* may be changed as appropriate. The semiconductor chips 3*a* to 3*l* are each a field effect transistor (FET) such as a MOSFET, or may be an insulated gate bipolar transistor (IGBT), a static induction (SI) thyristor, or a gate turn-off (GTO) thy ristor.

A printed board for control wiring (11, 12*a* to 12*e*) is arranged on the conductive substrate 1*a* on the top surface side. The printed board for control wiring (11, 12*a* to 12*e*) includes an insulating layer 11, and conductive layers 12*a* to 12*e* arranged separately from each other on the top surface side of the insulating layer 11. The insulating layer 11 is made of a ceramic plate mainly including aluminum oxide (Al$_2$O$_3$), aluminum nitride (AlN), silicon nitride (SisN$_4$), or boron nitride (BN), or a resin insulating layer including polymer material, for example. The conductive layers 12*a* to 12*e* each include copper (Cu) or aluminum (Al), for example.

The insulating layer 11 and the conductive layer 12*a* extend from the end part of the conductive substrate 1*a* along the region between the semiconductor chips 3*a* to 3*c* and the semiconductor chips 3*d* to 3*f*. The control terminal 4*a* is bonded to the conductive layer 12*a* by use of bonding material such as solder or sintered material. The conductive layer 12*a* is electrically connected to the respective gate electrodes of the semiconductor chips 3*a* to 3*f* via control wires (bonding wires) 72*a* to 72*f*. The control terminal 4*a* applies a control signal to the respective gate electrodes of the semiconductor chips 3*a* to 3*f* through the conductive layer 12*a* and the respective bonding wires 72*a* to 72*f*.

The conductive layer 12*b* is provided parallel to the conductive layer 12*a* so as to extend from the end part of the conductive substrate 1 along the region between the semiconductor chips 3*a* to 3*c* and the semiconductor chips 3*d* to 3*f*. The control terminal 4*b* is bonded to the conductive layer 12*b* by use of bonding material such as solder or sintered material. The conductive layer 12*b* is electrically connected to part of the respective source electrodes 31*a* to 31*f* of the semiconductor chips 3*a* to 3*f* via control wires (bonding wires) 71*a* to 71*f*. The control terminal 4*b* detects a current flowing through the respective source electrodes 31*a* to 31*l* of the semiconductor chips 3*a* to 3*f* via the respective bonding wires 71*a* to 71*f* and the conductive layer 12*b*.

The control terminal 4*c* is bonded to the conductive layer 12*c* by use of bonding material such as solder or sintered material. The control terminal 4*d* is bonded to the conductive layer 12*d* by use of bonding material such as solder or sintered material. A temperature detection chip 5 is bonded to the conductive layer 12*e* by use of bonding material such as solder or sintered material. The conductive layer 12*d* is connected to the temperature detection chip 5 via a control wire (a bonding wire) 73. The control terminal 4*d* detects a temperature detection signal from the temperature detection chip 5 through the bonding wire 73 and the conductive layer 12*d*.

The conductive substrate 1*a* is provided with pads 15*a* to 15*c* at positions on the top surface side adjacent to the conductive substrate 1*b*. The respective pads 15*a* to 15*c* are bonded to the top surface of the conductive substrate 1*a* by use of bonding material such as solder or sintered material. The pads 15*a* to 15*c* are made from conductive material such as copper (Cu) or aluminum (Al), for example. The respective pads 15*a* to 15*c* may be formed integrally with the conductive substrate 1*a*.

The conductive substrate 1*b* is provided with a printed board for control wiring (13, 14*a* to 14*c*) arranged on the top surface side. The printed board for control wiring (13, 14*a* to 14*c*) includes an insulating layer 13, and conductive layers 14*a* to 14*c* arranged separately from each other on the top surface side of the insulating layer 13. The insulating layer 13 can be made from the same material as the insulating layer 11, and the respective conductive layers 14*a* to 14*c* can be made from the same material as the conductive layers 12*a* to 12*e*.

The insulating layer 13 and the conductive layer 14*a* are arranged to extend from the end part of the conductive substrate 1*b* along the region between the semiconductor chips 3*g* to 3*i* and the semiconductor chips 3*j* to 3*l*. The control terminal 4*e* is bonded to the conductive layer 14*a* by use of bonding material such as solder or sintered material. The conductive layer 14*a* is electrically connected to the respective gate electrodes of the semiconductor chips 3*g* to 3*l* via control wires (bonding wires) 72*g* to 72*l*. The control terminal 4*e* applies a control signal to the respective gate electrodes of the semiconductor chips 3*g* to 3*l* through the conductive layer 14*a* and the bonding wires 72*g* to 72*l*.

The conductive layer 14*b* is arranged to extend parallel to the conductive layer 14*a* from the end part of the conductive substrate 1*b* along the region between the semiconductor chips 3*g* to 3*i* and the semiconductor chips 3*j* to 3*l*. The control terminal 4*f* is bonded to the conductive layer 14*b* by use of bonding material such as solder or sintered material. The conductive layer 14*b* is electrically connected to part of the respective source electrodes 31*g* to 31*l* of the semiconductor chips 3*g* to 3*l* via control wires (bonding wires) 71*g* to 71*l*. The control terminal 4*f* detects a current flowing through the respective source electrodes 31*g* to 31*l* of the semiconductor chips 3*g* to 3*l* via the bonding wires 71*g* to 71*l* and the conductive layer 14*b*.

The control terminal 4*g* is bonded to the conductive layer 14*c* by use of bonding material such as solder or sintered material. The conductive layer 14*c* is connected to the conductive substrate 1*b* via a control wire (a bonding wire) 74. The control terminal 4*g* detects a current flowing through the respective drain electrodes of the semiconductor chips 3*g* to 3*l* via the bonding wire 74 and the conductive layer 14*c*.

FIG. 9 is a perspective view illustrating the conductive member 6 implementing one of the constitutional elements of the integrated structure body (2*a*, 6, 8). As illustrated in FIG. 9, the conductive member 6 incudes pad bonding parts 61*a* to 61*c*, a connection part 62 connected to the pad bonding parts 61*a* to 61*c*, chip bonding parts 63*a* to 63*c* connected to the connection part 62, connection parts 64*a* to 64*c* connected to the chip bonding parts 63*a* to 63*c*, and chip bonding parts 63*d* to 6*f* connected to the connection parts 64*a* to 64*c*. The respective pad bonding parts 61*a* to 61*c* and the respective chip bonding parts 63*a* to 63*f* are bent to project downward and connected to the connection part 62 and the respective connection parts 64*a* to 64*c*. The respective connection parts 64*a* to 64*c* have a stripe-shaped planar pattern extending parallel to and separately from each other.

At least the respective bottom surfaces of the pad bonding parts 61*a* to 61*e* are exposed on the resin member 8 illustrated in FIG. 3 to FIG. 6. The pad bonding parts 61*a* to 61*c* are bonded to the pads 15*a* to 15*c* on the top surface side of the conductive substrate 1*a* illustrated in FIG. 7 and FIG. 8 by use of bonding material such as solder or sintered material. The connection part 62 and the respective connection parts 64a to 64c are covered with the resin member 8 illustrated in FIG. 3 to FIG. 6. At least the respective bottom surfaces of the chip bonding parts 63a to 63f are exposed on the resin member 8 illustrated in FIG. 3 to FIG. 6. The chip bonding parts 63a to 63f are bonded to the source electrodes 31g to 31l of the semiconductor chips 3g to 3l illustrated in FIG. 7 and FIG. 8 by use of bonding material such as solder or sintered material.

FIG. 10 is a perspective view illustrating the negative electrode terminal 2a implementing one of the constitutional elements of the integrated structure body (2a, 6. 8). As illustrated in FIG. 10, the negative electrode terminal 2a includes chip bonding parts 21a to 21c, connection parts 22a to 22c connected to the chip bonding parts 21a to 21c, chip bonding parts 21d to 21f connected to the connection parts 22a to 22c, a connection part 23 connected to the chip bonding parts 21d to 21f, and an external connection part 24 connected to the connection part 23. The chip bonding parts 21a to 21f, the connection parts 22a to 22c, and the external connection part 24 are exposed on the resin member 8 illustrated in FIG. 3 to FIG. 6. The connection part 23 is partly exposed on the resin member 8 illustrated in FIG. 3 to FIG. 6, while the other part of the connection part 23 is covered with the resin member 8.

The respective chip bonding parts 21a to 21f illustrated in FIG. 10 are bent to project downward and connected to the connection parts 22a to 22c. The chip bonding parts 21a to 21f are bonded to the source electrodes 31a to 31f of the semiconductor chips 3a to 3f illustrated in FIG. 7 and FIG. 8 by use of bonding material such as solder or sintered material. The respective connection parts 22a to 22c have a stripe-shaped planar pattern extending parallel to and separately from each other.

The connection part 23 has a substantially rectangular planar pattern. The connection part 23 is arranged to be opposed to the pad bonding parts 61a to 61c, the connection part 62, the chip bonding parts 63a to 63f, and the connection parts 64a to 64c of the conductive member 6 illustrated in FIG. 9. The connection part 23 is provided with openings 23a and 23b penetrating from the top surface to the bottom surface of the connection part 23. The openings 23a and 23b each have a substantially rectangular planar pattern. The opening 23a is located to overlap with the space between the respective connection parts 64a and 64b illustrated in FIG. 9. The opening 23b is located to overlap with the space between the respective connection parts 64b and 64c illustrated in FIG. 9.

The opening 23a is located to overlap with a control wiring region in a plan view including the bonding wires 71h, 71k, 72h, and 72k connected to the semiconductor chips 3h and 3k illustrated in FIG. 7 and FIG. 8. The opening 23b is located to overlap with a control wiring region including the bonding wires 71i, 71l, 72i, and 72l connected to the semiconductor chips 3i and 3l illustrated in FIG. 7 and FIG. 8.

The part of the negative electrode terminal 2a corresponding to the external connection part 24 may be defined as a "negative electrode terminal", and the other part including the chip bonding parts 21a to 21c, the connection parts 22a to 22c, the chip bonding pats 21d to 21f, and the connection part 23 other than the extema connection part 24 may be defined as a "lead frame" integrated with the "negative electrode terminal".

FIG. 11 is a perspective view illustrating the resin member 8 implementing one of the constitutional elements of the integrated structure body (2a, 6, 8). As illustrated in FIG. 11, the resin member 8 includes a body part 80 having a substantially rectangular cuboidal outline. The body part 80 is provided on one of the side surfaces with an opening 82 and openings 83a to 83c. The connection part 23 of the negative electrode terminal 2a is partly exposed outward through the opening 82. The pad bonding parts 61a to 61c of the conductive member 6 are exposed outward through the openings 83a to 83c respectively. The body part 80 is provided with openings 81a and 81b penetrating from the top surface to the bottom surface of the body part 80. The openings 81a and 81b are located to respectively overlap with the openings 23a and 23b of the negative electrode terminal 2a illustrated in FIG. 10.

As illustrated in FIG. 3 and FIG. 4, the opening 81a of the resin member 8 is located to overlap with the control wiring region including the bonding wires 71h, 71k. 72h, and 72k connected to the semiconductor chips 3h and 3k in the plan view when the integrated structure body (2a, 6, 8) is arranged on the top surface side of the respective conductive substrates 1a and 1b. The opening 81b is located to overlap with the control wiring region including the bonding wires 71i, 71l, 72i, and 72l connected to the semiconductor chips 3i and 3l.

As illustrated in FIG. 4 to FIG. 6, a support part 84 and support parts 85a to 85e are provided on the bottom surface side of the body part 80. FIG. 4 schematically indicates the support parts 85a to 85e hidden under the body part 80 by the broken lines. The support part 84 and the support parts 85a to 85e are formed integrally with the body part 80. The support part 84 is arranged on the top surface side of the conductive substrate 1a. The support parts 85a to 85e are arranged on the top surface side of the conductive substrate 1b. The respective support parts 85a to 85e are illustrated with a case of having a pillar-like shape, for example, but are not limited to this case. The arranged positions and the number of the support parts 85a to 85e may be changed as appropriate.

The provision of the support part 84 and the support parts 85a to 85e on the bottom surface side of the body part 80 can suppress an inclination of the integrated structure body (2a, 6, 8) including the chip bonding parts 21a to 21f of the negative electrode terminal 2a and the chip bonding parts 63a to 63f of the conductive member 6 so as to avoid an increase in height of the integrated structure body (2a, 6, 8) when the chip bonding parts 21a to 21f and the chip bonding parts 63a to 63f are bonded by soldering to the respective source electrodes of the semiconductor chips 3a to 3l.

The surface of the resin member 8 may be subjected to embossing treatment so as to be roughened. The roughened surface of the resin member 8 can avoid a separation and thus improve the adhesion between the resin member 8 and the sealing resin 10. Either the entire surface or a part of the surface of the resin member 8 can be subjected to the roughening.

FIG. 12 is a schematic side view illustrating a packaged structure of a semiconductor device 101 according to the first embodiment. The semiconductor device 101 corresponds to the semiconductor device illustrated in FIG. 1 and FIG. 2, and the respective bottom surfaces of the conductive substrates 1a and 1b are exposed on the bottom surface of the semiconductor device 101. A cooling device (a base) 103 is arranged on the bottom surface side of the semiconductor device 101 with a sheet-like resin layer (a resin sheet) 102 interposed.

The resin sheet 102 is a member for ensuring both the insulation and the adhesion between the semiconductor device 101 and the cooling device 103 while enabling the release of heat from the semiconductor device 101 toward the cooling device 103. The material used for the resin sheet 102 can be epoxy resin, for example. The material used for the cooling device 103 can be copper (Cu), aluminum (Al), composite material (AISiC) including Al and silicon carbide, or composite material (MgSiC) including magnesium (Mg) and silicon carbide, for example.

The packaged structure of the semiconductor device 101 can integrate the functions of the insulation, the adhesion, and the heat release into the resin sheet 102, so as to reduce the costs accordingly, as compared with a case in which the insulated circuit substrate is bonded to the cooling device by soldering.

FIG. 13 is an equivalent circuit diagram illustrating the semiconductor device according to the first embodiment. As illustrated in FIG. 13, the semiconductor device according to the first embodiment implements a part of a three-phase bridge circuit. A drain electrode of a transistor T1 on the upper arm side is connected to a positive electrode terminal P, and a source electrode of a transistor T2 on the lower arm side is connected to a negative electrode terminal N. A source electrode of the transistor T1 and a drain electrode of the transistor T2 are connected to an output terminal U and an auxiliary source terminal S1. An auxiliary source terminal S2 is connected to the source electrode of the transistor T2. Gate control terminals G1 and G2 are connected to the gate electrodes of the transistors T1 and T2. Body diodes D1 and D2 each serving as a freewheeling diode (FWD) are internally connected in antiparallel to the transistors T1 and T2.

The output terminal U, the positive electrode terminal P, and the negative electrode terminal N illustrated in FIG. 13 respectively correspond to the output terminal 2c, the positive electrode terminal 2b, and the negative electrode terminal 2a illustrated in FIG. 7 and FIG. 8. The transistor T1 and the body diode D1 illustrated in FIG. 13 correspond to the semiconductor chips 3g and 3l illustrated in FIG. 7 and FIG. 8. The transistor T2 and the body diode D2 illustrated in FIG. 13 correspond to the semiconductor chips 3a to 3f illustrated in FIG. 7 and FIG. 8. The gate control terminals G1 and G2 illustrated in FIG. 13 correspond to the control terminals 4a and 4e illustrated in FIG. 7 and FIG. 8. The auxiliary source terminals S1 and S2 illustrated in FIG. 13 correspond to the control terminals 4b and 4f illustrated in FIG. 7 and FIG. 8.

An example of a method of manufacturing the semiconductor device according to the first embodiment is described below. As illustrated in FIG. 7 and FIG. 8, the output terminal 2c, the semiconductor chips 3a to 3f, the printed board (11, 12a to 12e), and the pads 15a to 15c are bonded to the top surface of the conductive substrate 1a by use of bonding material such as solder or sintered material. The control terminals 4a to 4d and the temperature detection chip 5 are further bonded to the top surface of the printed board (11, 12a to 12e) by use of bonding material such as solder or sintered material. The semiconductor chips 3a to 3f, the printed board (11, 12a to 12e), and the temperature detection chip 5 are then connected to each other via the bonding wires 71a to 71f, 72a to 72f, and 73.

As illustrated in FIG. 7 and FIG. 8, the positive electrode terminal 2b, the semiconductor chips 3g to 3l, and the printed board (13, 14a to 14c) are bonded to the top surface of the conductive substrate 1b by use of bonding material such as solder or sintered material. The control terminals 4e to 4g are further bonded to the top surface of the printed board (13, 14a to 14c) by use of bonding material such as solder or sintered material. The semiconductor chips 3g to 3l and the printed board (13, 14a to 14c) are then connected to each other via the bonding wires 71g to 71l and 72g to 72l.

The conductive member 6 illustrated in FIG. 9, the negative electrode terminal 2a illustrated in FIG. 10, and the resin member 8 illustrated in FIG. 1l are formed integrally by integral molding with a metal mold so as to prepare the integrated structure body (2a, 6, 8).

Next, as illustrated in FIG. 3 to FIG. 6, the conductive substrate 1a to which the semiconductor chips 3a to 3f and the like are bonded and the conductive substrate 1b to which the semiconductor chips 3g to 3l and the like are bonded are led to be opposed to the integrated structure body (2a, 6, 8). The chip bonding parts 21a to 21f of the negative electrode terminal 2a implementing a part of the integrated structure body (2a, 6, 8) are then bonded to the source electrodes 31a to 31f of the semiconductor chips 3a to 3f by use of bonding material such as solder or sintered material. Similarly, the chip bonding parts 63a to 63f of the conductive member 6 implementing a part of the integrated structure body (2a, 6, 8) are bonded to the source electrodes 31g to 31l of the semiconductor chips 3g to 3l by use of bonding material such as solder or sintered material. Similarly, the pad bonding parts 61a to 61c of the conductive member 6 are bonded to the pads 15a to 15c on the top surface side of the conductive substrate 1a by use of bonding material such as solder or sintered material.

Next, the semiconductor chips 3a to 3l and the like are sealed with the sealing resin 10 by transfer molding, as illustrated in FIG. 1. The semiconductor device according to the first embodiment is thus completed.

The semiconductor device according to the first embodiment described above has the integrated structure body (2a, 6, 8) including the negative electrode terminal 2a, the conductive member 6, and the resin member 8 integrated together so as to implement a three-dimensionally-wired main wiring circuit, while including the control wiring circuit implemented by the printed board for control wiring (11, 12a to 12e) and the printed board for control wiring (13, 14a to 14e) so as to include the separated substrates.

The semiconductor device according to the first embodiment having the configuration as described above thus can decrease the wiring area, so as to achieve a reduction in chip size and cost and also ensure the low inductance properties, as compared with the conventional semiconductor device in which the semiconductor chips are mounted on the circuit pattern of the insulated circuit substrate so that the semiconductor chips and the circuit pattern of the insulated circuit substrate are electrically connected together via lead frames and bonding wires.

Further, the semiconductor device according to the first embodiment having the configuration as described above can ensue the reliability of the connection parts, so as to facilitate an inspection process to achieve a reduction in cost accordingly, as compared with the conventional semiconductor device in which the printed board is arranged over the semiconductor chips mounted on the insulated circuit substrate so that the semiconductor chips and the printed board are electrically connected together by use of pin terminals. Further, the semiconductor device according to the first embodiment does not have a problem of a cause of any curve or thermal deformation in the printed board, so as to increase the packaging performance and increase the reliability to facilitate the handling accordingly.

Further, the semiconductor device according to the first embodiment having the configuration as described above does not need to use a case, so as to achieve a reduction in space, a decrease in the number of manufacturing steps, and a reduction in cost, as compared with the conventional semiconductor device that uses a case for surrounding the insulated circuit substrate so as to inject resin by potting to seal the insulated circuit substrate.

As described above, the semiconductor device according to the first embodiment can exhibit the wiring technique that contributes to a reduction in cost and facilitate the manufacturing process without requiring a complicated member-positioning accurate control technique, and can further keep the heat-releasing performance and achieve the low inductance performance that can maximize the characteristics of the semiconductor chips including silicon carbide (SiC) and the like. The semiconductor device according to the first embodiment having the configuration as described above is particularly effective for a case in which a plurality of small semiconductor chips including SiC are connected in parallel in order to reduce the manufacturing costs, since this configuration can greatly contribute to a decrease in wiring area if including the plural semiconductor chips.

SECOND EMBODIMENT

A semiconductor device according to a second embodiment has an external appearance similar to that of the semiconductor device according to the first embodiment illustrated in FIG. 1 and FIG. 2. FIG. 14 is a perspective view illustrating the semiconductor device according to the second embodiment while omitting the sealing resin 10 illustrated in FIG. 1 and FIG. 2, and FIG. 15 is a plan view corresponding to FIG. 14.

As illustrated in FIG. 14 and FIG. 15, the semiconductor device according to the second embodiment differs from the semiconductor device according to the first embodiment in including a resin member 9 arranged to be interposed between the negative electrode terminal 2a and the conductive member 6. The semiconductor device according to the second embodiment has a laminated structure body (2a, 6, 9) including the negative electrode terminal 2a, the conductive member 6, and the resin member 9 stacked together. The negative electrode terminal 2a and the conductive member 6 implementing the constitutional elements of the laminated structure body (2a, 6, 9) have the same structure as the negative electrode terminal 2a illustrated in FIG. 10 and the conductive member 6 illustrated in FIG. 9.

FIG. 16 is a perspective view illustrating the resin member 9 as one of the constituent elements of the laminated structure body (2a, 6, 9). As illustrated in FIG. 16, the resin member 9 includes a flat part 90 and stripe parts 91a to 91c connected to the flat part 90. The flat part 90 is arranged between the connection part 62 of the conductive member 6 illustrated in FIG. 9 and the connection part 23 of the negative electrode terminal 2a illustrated in FIG. 10. The flat part 90 is provided with a projecting part 94 on the bottom surface side. The projecting part 94 is fitted to the pad bonding parts 61a to 61c of the conductive member 6 curved downward illustrated in FIG. 9. The flat part 90 is not necessarily provided with the projecting part 94.

The stripe part 91a is interposed between the chip bonding part 63a, the connection part 64a, and the chip bonding part 63d of the conductive member 6 illustrated in FIG. 9 and the stripe part of the negative electrode terminal 2a toward the end part on the outer side of the opening 23a of the connection part 23 illustrated in FIG. 10. The stripe part 91a is provided with projecting parts 95a and 95d on the bottom surface side. The projecting parts 95a and 95d are fitted to the chip bonding parts 63a and 63d of the conductive member 6 curved downward illustrated in FIG. 9.

The stripe part 91b is interposed between the chip bonding part 63b, the connection part 64b, and the chip bonding part 63e of the conductive member 6 illustrated in FIG. 9 and the stripe part located between the respective openings 23a and 23b of the connection part 23 of the negative electrode terminal 2a illustrated in FIG. 10. The stripe part 91b is provided with projecting parts 95b and 95e on the bottom surface side. The projecting parts 95b and 95e are fitted to the chip bonding parts 63b and 63e of the conductive member 6 curved downward illustrated in FIG. 9.

The stripe part 91c is interposed between the chip bonding part 63c, the connection part 64c, and the chip bonding part 63f of the conductive member 6 illustrated in FIG. 9 and the stripe part of the negative electrode terminal 2a toward the end part on the outer side of the opening 23b of the connection part 23 illustrated in FIG. 10. The stripe part 91c is provided with projecting parts 95c and 95f on the bottom surface side. The projecting parts 95c and 95f are fitted to the chip bonding parts 63c and 63f of the conductive member 6 curved downward illustrated in FIG. 9.

The space between the respective stripe parts 91a and 91b is defined to overlap with the space between the respective connection parts 64a and 64b of the conductive member 6 illustrated in FIG. 9 and overlap with the opening 23a of the connection part 23 of the negative electrode terminal 2a illustrated in FIG. 10. The space between the respective stripe parts 91b and 91c is defined to overlap with the space between the respective connection parts 64b and 64c of the conductive member 6 illustrated in FIG. 9 and overlap with the opening 23b of the connection part 23 of the negative electrode terminal 2a illustrated in FIG. 10.

FIG. 17 is a side view illustrating the laminated structure body (2a, 6, 9). As illustrated in FIG. 17, the chip bonding parts 63c and 63f of the conductive member 6 on the top surface side are in contact with the projecting parts 95c and 95f of the resin member 9 respectively. Similarly, the chip bonding parts 63a, 63b, 63d, and 63e of the conductive member 6 on the top surface side are in contact with the projecting parts 95a, 95b. 95d, and 95e of the resin member 9 respectively. As illustrated in FIG. 17, the flat part 90 and the stripe part 91c of the resin member 9 on the top surface side are in contact with the bottom surface of the connection part 23 of the negative electrode terminal 2a. Similarly, the respective stripe parts 91a and 91b of the resin member 9 on the top surface side are in contact with the bottom surface of the connection part 23 of the negative electrode terminal 2a.

FIG. 18 is an enlarged side view of region A surrounded by the broken line illustrating the circumference of the projecting part 95c of the resin member 9 in FIG. 17. The side surface of the projecting part 95c of the resin member 9 is provided with engagement parts (protruding parts) 92a and 92b. The curved part of the projecting part 63c of the conductive member 6 is provided with engagement parts (recessed parts) 65a and 65b. The protruding parts 92a and 92b of the resin member 9 and the recessed parts 65a and 65b of the conductive member 6 are engaged (fitted) together, so as to fix the conductive member 6 and the resin member 9 to each other.

FIG. 19 is a view illustrating an example of a method of assembling the laminated structure body (2a, 6, 9) illustrated in FIG. 17. First, the negative electrode terminal 2a, the resin member 9, and the conductive member 6 are prepared, and the top surface of the resin member 9 is bonded (fixed) to the bottom surface of the negative electrode terminal 2a by pressure bonding, for example, as illustrated in FIG. 19. Next, the top surface of the conductive member 6 is opposed to the bottom surface of the resin member 9 fixed to the negative electrode terminal 2a so as to be fixed together by pressure bonding, for example. At this point, the protruding parts 92a and 92b of the resin member 9 and the recessed parts 65a and 65b of the conductive member 6 are engaged (fitted) together, so as to stably fix the top surface of the conductive member 6 to the bottom surface of the resin member 9.

The other configurations of the semiconductor device according to the second embodiment are substantially the same as the semiconductor device according to the first embodiment, and overlapping explanations are not repeated below.

The semiconductor device according to the second embodiment has the laminated structure body (2a, 6, 9) including the negative electrode terminal 2a, the conductive member 6, and the resin member 9 integrated together so as to implement the three-dimensionally-wired main wiring circuit, while including the control wiring circuit implemented by the printed board for control wiring (11, 12a to 12e) and the printed board for control wiring (13, 14a to 14e) so as to include the separated substrates. This configuration can decrease the wiring area, so as to avoid an increase in chip size and cost, ensuring the low inductance properties accordingly.

FIG. 20 is a perspective view illustrating another example of the conductive member 6 implementing one of the constituent elements of the laminated structure body (2a, 6, 9). The conductive member 6 illustrated in FIG. 20 differs from the conductive member 6 illustrated in FIG. 9 in further having a connection part 65 connected to the chip bonding parts 63d to 63f. FIG. 21 is a perspective view illustrating another example of the resin member 9 implementing one of the constituent elements of the laminated structure body (2a, 6, 9). The resin member 9 illustrated in FIG. 21 differs from the resin member 9 illustrated in FIG. 16 in further having a connection part 97 connected to the stripe parts 91a to 91c. The semiconductor device according to the second embodiment may include the laminated structure body (2a, 6, 9) implemented by the conductive member 6 illustrated in FIG. 20, the resin member 9 illustrated in FIG. 21, and the negative electrode terminal 2a illustrated in FIG. 10.

OTHER EMBODIMENTS

While the present invention has been described above by reference to the first and second embodiments, it should be understood that the present invention is not intended to be limited to the descriptions and the drawings composing part of this disclosure. Various alternative embodiments, examples, and technical applications will be apparent to those skilled in the art according to this disclosure.

For example, the first and second embodiments have been illustrated with the case of including the conductive substrate 1a and the conductive substrate 1b, but the present invention may also be applied to a case of using a circuit pattern on the upper surface side of an insulated circuit substrate such as a direct copper bonded (DCB) substrate for the conductive substrate 1a and the conductive substrate 1b.

Further, the configurations disclosed in the first and second embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present specification.

The invention claimed is:

1. A semiconductor device comprising:
   a first semiconductor chip and a second semiconductor chip each including a first main electrode on a bottom surface side and a second main electrode on a top surface side;
   a conductive member provided to electrically connect the first main electrode of the first semiconductor chip to the second main electrode of the second semiconductor chip;
   a first external terminal electrically connected to the second main electrode of the first semiconductor chip and the first external terminal partly overlapping the conductive member in a direction perpendicular to the top surface side of the second semiconductor chip; and
   an insulating resin member provided to be at least partly arranged in an overlapping region between the conductive member and the first external terminal above the top surface side of the second semiconductor chip,
   wherein the first external terminal, the insulating resin member, and the conductive member are configured with an opening penetrating through the first external terminal, the insulating resin member, and the conductive member, to expose at least a portion of the top surface side of the second semiconductor chip.

2. The semiconductor device of claim 1, comprising a half bridge circuit including a lower arm implemented by the first semiconductor chip and an upper arm implemented by the second semiconductor chip.

3. The semiconductor device of claim 1, wherein the insulating resin member is formed integrally with the conductive member and the first external terminal.

4. The semiconductor device of claim 3, wherein the insulating resin member is provided with a support part on a bottom surface side.

5. The semiconductor device of claim 1, wherein the insulating resin member is fixed to either the conductive member or the first external terminal.

6. The semiconductor device of claim 5, wherein the conductive member and the insulating resin member are provided with engagement parts engaged with each other.

7. The semiconductor device of claim 1, wherein the opening exposes the portion of the top surface side of the second semiconductor chip that overlaps a control wiring region of the second semiconductor chip.

8. The semiconductor device of claim 1, wherein a surface of the insulating resin member is a roughened surface.

9. The semiconductor device of claim 8, further comprising a sealing member adhered to the roughened surface of the insulating resin member to form an adhered interface between the sealing member and the insulating resin member, wherein the sealing member seals the first semiconductor chip and the second semiconductor chip.

10. The semiconductor device of claim 1, further comprising:
    a first conductive substrate to which the bottom surface side of the first semiconductor chip is bonded; and
    a second conductive substrate to which the bottom surface side of the second semiconductor chip is bonded.

11. The semiconductor device of claim 10, further comprising:
    a second external terminal bonded to the first conductive substrate; and a third external terminal bonded to the second conductive substrate.

12. The semiconductor device of claim 11, further comprising:
a resin sheet arranged on a bottom surface side of the first conductive substrate and the second conductive substrate; and
a cooling device arranged on a bottom surface side of the resin sheet.

13. The semiconductor device of claim 10, further comprising:
a first printed board arranged on a top surface of the first conductive substrate and electrically connected to a control electrode on the top surface side of the first semiconductor chip; and
a second printed board arranged on a top surface of the second conductive substrate and electrically connected to a control electrode on the top surface side of the second semiconductor chip.

14. The semiconductor device of claim 10, wherein the conductive member includes:
a chip bonding part bonded to the second main electrode of the second semiconductor chip; and
a pad bonding part bonded to a pad on a top surface side of the first conductive substrate.

15. The semiconductor device of claim 1, wherein the first external terminal includes:
a chip bonding part bonded to the second main electrode of the first semiconductor chip; and
a connection part overlapping the conductive member.

* * * * *